United States Patent
Pagaila et al.

(10) Patent No.: US 8,940,636 B2
(45) Date of Patent: Jan. 27, 2015

(54) THROUGH HOLE VIAS AT SAW STREETS INCLUDING PROTRUSIONS OR RECESSES FOR INTERCONNECTION

(75) Inventors: Reza A. Pagaila, Singapore (SG); Zigmund R. Camacho, Singapore (SG); Lionel Chien Hui Tay, Singapore (SG); Byung Tai Do, Singapore (SG)

(73) Assignee: STATS ChipPAC, Ltc., Singapore (SG)

( * ) Notice: Subject to any disclaimer, the term of this patent is extended or adjusted under 35 U.S.C. 154(b) by 105 days.

(21) Appl. No.: 13/273,537

(22) Filed: Oct. 14, 2011

(65) Prior Publication Data

US 2012/0034777 A1      Feb. 9, 2012

Related U.S. Application Data

(62) Division of application No. 12/057,199, filed on Mar. 27, 2008, now Pat. No. 8,072,079.

(51) Int. Cl.
*H01L 21/44*      (2006.01)
*H01L 21/683*      (2006.01)
(Continued)

(52) U.S. Cl.
CPC .......... *H01L 21/6835* (2013.01); *H01L 21/568* (2013.01); *H01L 23/3114* (2013.01); *H01L 23/5389* (2013.01); *H01L 24/12* (2013.01); *H01L 24/19* (2013.01); *H01L 24/25* (2013.01); *H01L 24/28* (2013.01); *H01L 24/94* (2013.01); *H01L 24/96* (2013.01); *H01L 24/97* (2013.01); *H01L 25/0657* (2013.01); *H01L 25/105* (2013.01); *H01L 25/50* (2013.01); *H01L 24/81* (2013.01); *H01L 2221/68372* (2013.01); *H01L 2224/05009* (2013.01); *H01L 2224/0557* (2013.01); *H01L 2224/13009* (2013.01); *H01L 2224/13099* (2013.01); *H01L 2224/24011* (2013.01); *H01L 2224/81801* (2013.01); *H01L 2224/81894* (2013.01); *H01L 2224/82039* (2013.01); *H01L 2225/06551* (2013.01); *H01L 2924/01013* (2013.01);
(Continued)

(58) Field of Classification Search
CPC ............... H01L 21/76898; H01L 2224/32145; H01L 23/481; H01L 2225/06541
USPC .......... 438/460, 667; 257/686, 678, E23.011, 257/E21.597
See application file for complete search history.

(56) References Cited

U.S. PATENT DOCUMENTS 6,693,361 B1    2/2004   Siniaguine et al.
6,727,116 B2    4/2004   Poo et al.
(Continued)

*Primary Examiner* — Steven J Fulk
(74) *Attorney, Agent, or Firm* — Robert D. Atkins; Patent Law Group: Atkins and Associates, P.C.

(57) ABSTRACT

A semiconductor package includes a semiconductor wafer having a plurality of semiconductor die. A contact pad is formed over and electrically connected to an active surface of the semiconductor die. A gap is formed between the semiconductor die. An insulating material is deposited in the gap between the semiconductor die. An adhesive layer is formed over a surface of the semiconductor die and the insulating material. A via is formed in the insulating material and the adhesive layer. A conductive material is deposited in the via to form a through hole via (THV). A conductive layer is formed over the contact pad and the THV to electrically connect the contact pad and the THV. The plurality of semiconductor die is singulated. The insulating material can include an organic material. The active surface of the semiconductor die can include an optical device.

21 Claims, 23 Drawing Sheets

(51) Int. Cl.
*H01L 21/56* (2006.01)
*H01L 23/31* (2006.01)
*H01L 23/538* (2006.01)
*H01L 23/00* (2006.01)
*H01L 25/065* (2006.01)
*H01L 25/10* (2006.01)
*H01L 25/00* (2006.01)

(52) U.S. Cl.
CPC ............... *H01L 2924/01029* (2013.01); *H01L 2924/01047* (2013.01); *H01L 2924/01075* (2013.01); *H01L 2924/01078* (2013.01); *H01L 2924/01079* (2013.01); *H01L 2924/09701* (2013.01); *H01L 2924/12044* (2013.01); *H01L 2924/14* (2013.01); *H01L 2924/1433* (2013.01); *H01L 2924/19041* (2013.01); *H01L 2924/19042* (2013.01); *H01L 2924/19043* (2013.01); *H01L 2924/30105* (2013.01); *H01L 2224/9202* (2013.01); *H01L 2924/01006* (2013.01); *H01L 2924/01033* (2013.01); *H01L 2924/014* (2013.01); *H01L 2224/16147* (2013.01); *H01L 2224/16237* (2013.01); *H01L 2224/81191* (2013.01); *H01L 2224/81141* (2013.01); *H01L 2224/32145* (2013.01); *H01L 2225/06558* (2013.01); *H01L 2924/0132* (2013.01); *H01L 2225/1035* (2013.01); *H01L 2225/1058* (2013.01); *H01L 2224/73267* (2013.01); *H01L 2224/02372* (2013.01)
USPC .................. 438/667; 257/678; 257/E23.011; 257/E21.597; 438/460

(56) References Cited

U.S. PATENT DOCUMENTS

| | | | |
|---|---|---|---|
| 2002/0001922 A1* | 1/2002 | Farnworth | 438/464 |
| 2002/0158345 A1* | 10/2002 | Hedler et al. | 257/786 |
| 2003/0100143 A1* | 5/2003 | Mulligan et al. | 438/113 |
| 2003/0230805 A1* | 12/2003 | Noma et al. | 257/737 |
| 2004/0075761 A1* | 4/2004 | Maeda et al. | 348/340 |
| 2004/0137701 A1* | 7/2004 | Takao | 438/461 |
| 2005/0046002 A1* | 3/2005 | Lee et al. | 257/678 |
| 2005/0121781 A1* | 6/2005 | Shizuno | 257/730 |
| 2005/0167812 A1* | 8/2005 | Yoshida et al. | 257/686 |
| 2005/0194670 A1* | 9/2005 | Kameyama et al. | 257/678 |
| 2005/0230804 A1* | 10/2005 | Tanida et al. | 257/690 |
| 2006/0019467 A1* | 1/2006 | Lee et al. | 438/462 |
| 2006/0019484 A1* | 1/2006 | Chen et al. | 438/618 |
| 2006/0038288 A1* | 2/2006 | Yoshioka et al. | 257/730 |
| 2006/0065976 A1* | 3/2006 | Hsuan et al. | 257/734 |
| 2006/0118972 A1* | 6/2006 | Baek et al. | 257/786 |
| 2006/0141750 A1* | 6/2006 | Suzuki et al. | 438/460 |
| 2006/0220256 A1 | 10/2006 | Shim et al. | |
| 2007/0158807 A1* | 7/2007 | Lu et al. | 257/686 |
| 2007/0172982 A1 | 7/2007 | Huang et al. | |
| 2007/0172983 A1 | 7/2007 | Huang et al. | |
| 2007/0172984 A1 | 7/2007 | Huang et al. | |
| 2007/0172985 A1 | 7/2007 | Huang et al. | |
| 2007/0172986 A1 | 7/2007 | Huang et al. | |
| 2007/0187711 A1 | 8/2007 | Hsiao et al. | |
| 2007/0216006 A1 | 9/2007 | Park et al. | |
| 2007/0284729 A1* | 12/2007 | Kwon et al. | 257/700 |
| 2008/0001269 A1* | 1/2008 | Hsu et al. | 257/678 |
| 2008/0117607 A1* | 5/2008 | Murayama et al. | 361/760 |
| 2008/0128883 A1* | 6/2008 | Lee | 257/686 |
| 2008/0203556 A1* | 8/2008 | Huang | 257/698 |
| 2008/0272465 A1 | 11/2008 | Do et al. | |
| 2008/0272476 A1* | 11/2008 | Do et al. | 257/686 |
| 2008/0274603 A1 | 11/2008 | Do et al. | |
| 2009/0108468 A1* | 4/2009 | Han | 257/777 |
| 2009/0166785 A1 | 7/2009 | Camacho et al. | |
| 2009/0212438 A1* | 8/2009 | Kreupl et al. | 257/773 |

* cited by examiner

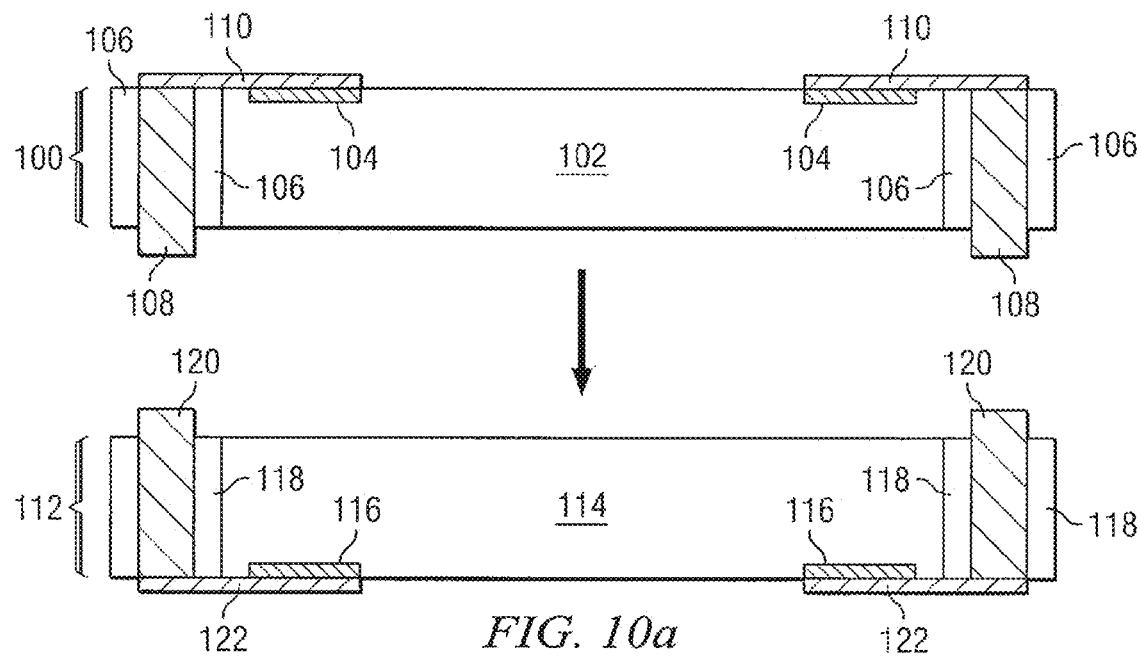
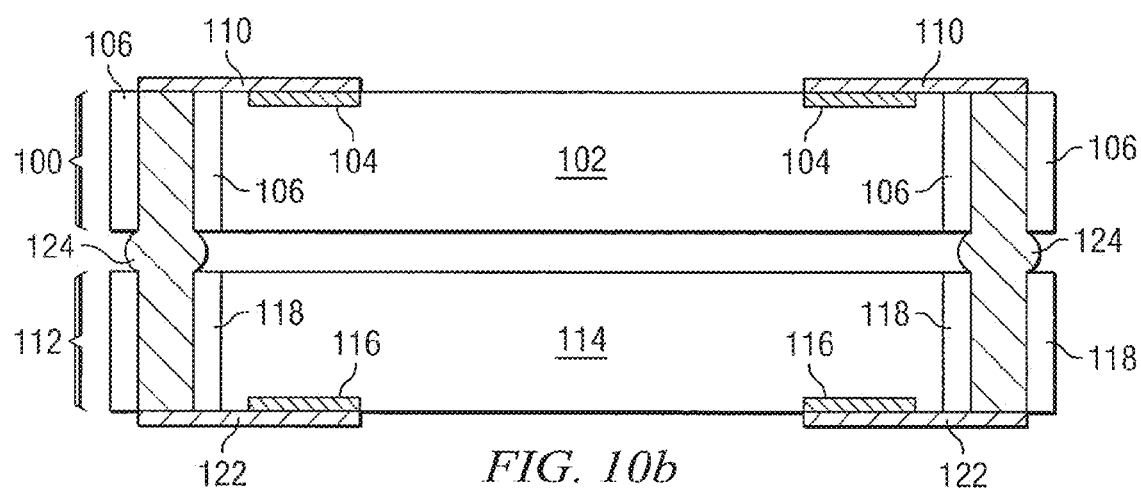
FIG. 10a
FIG. 10b

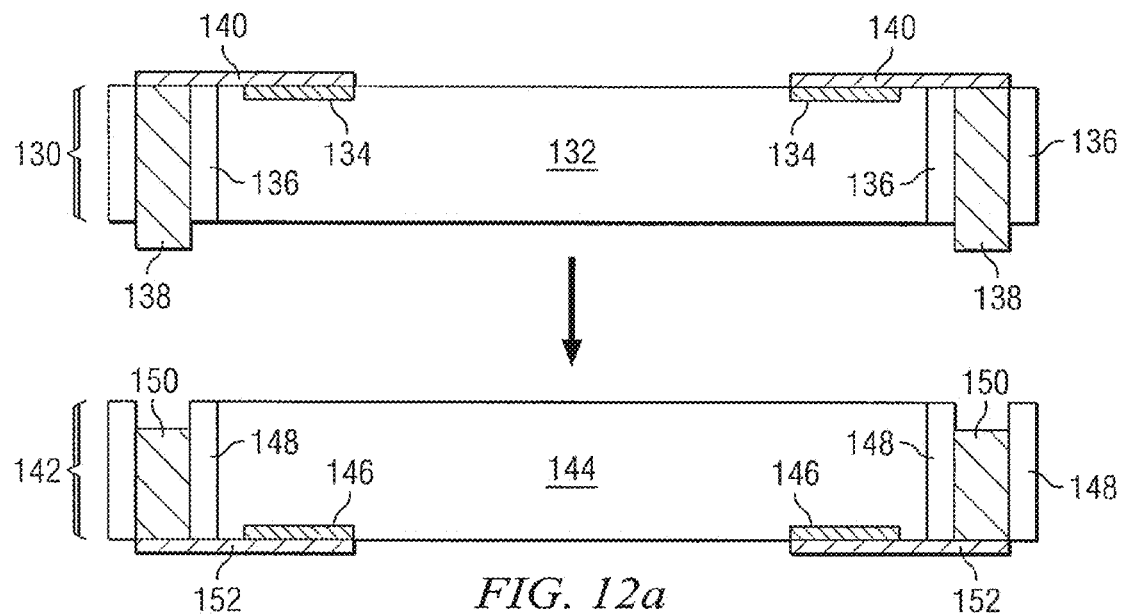
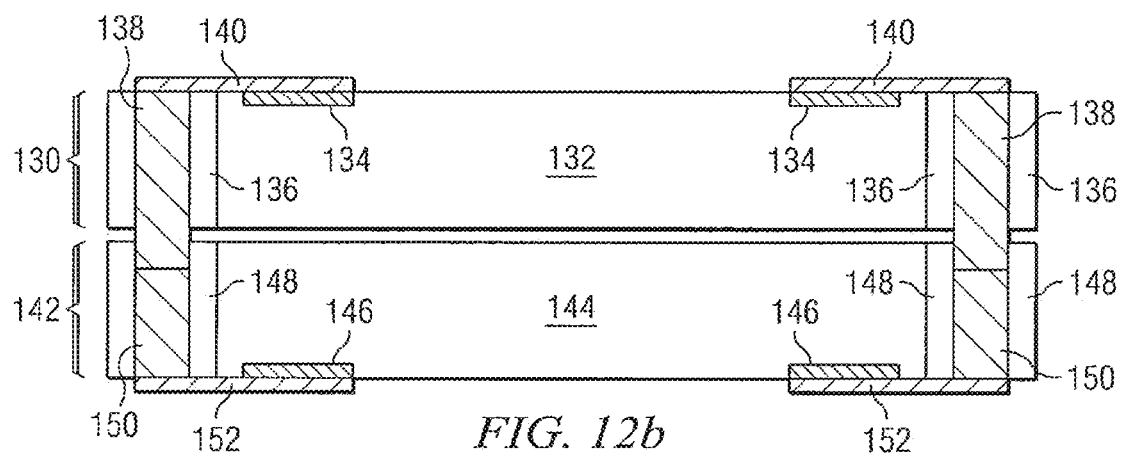

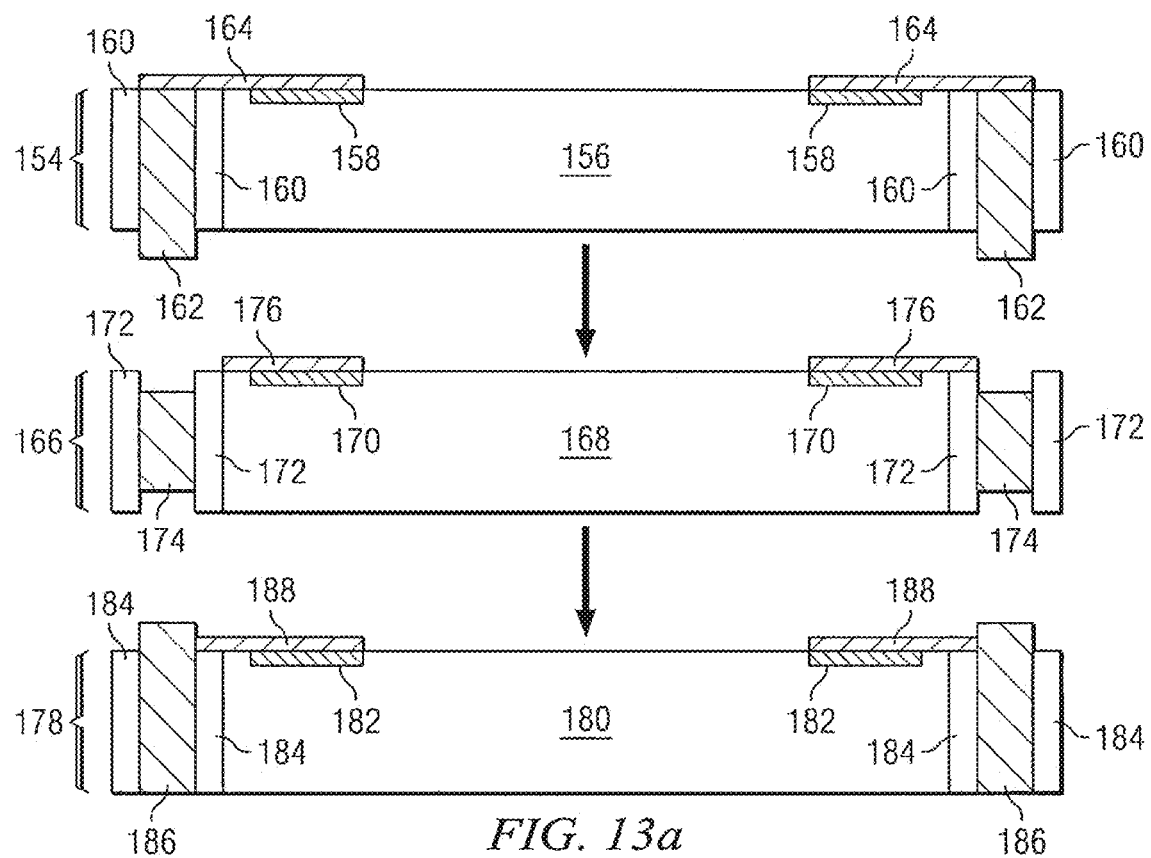
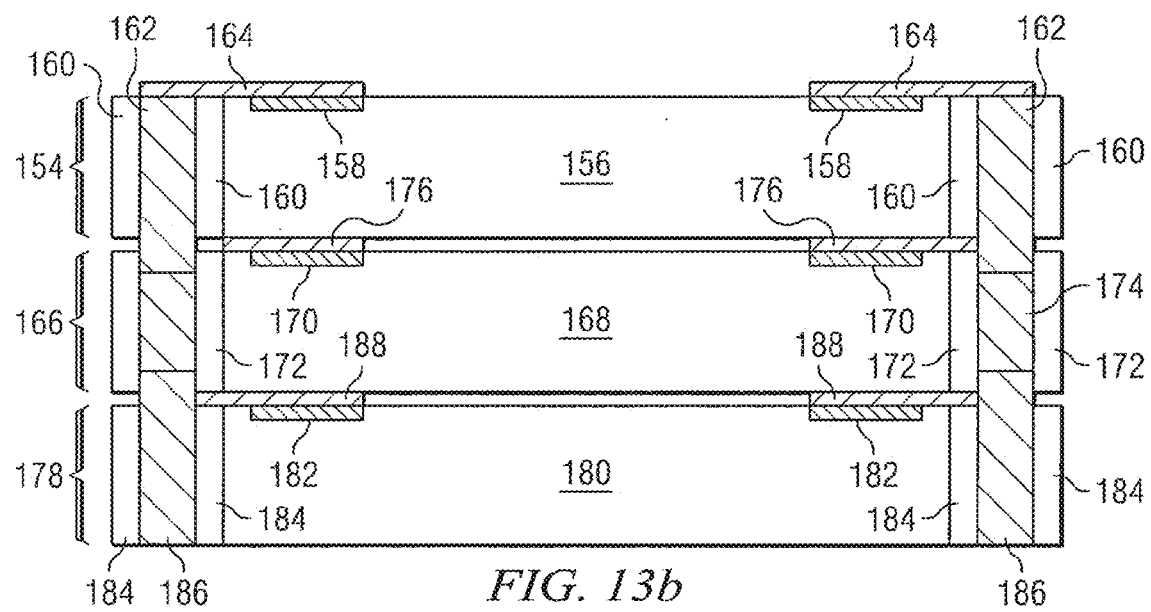

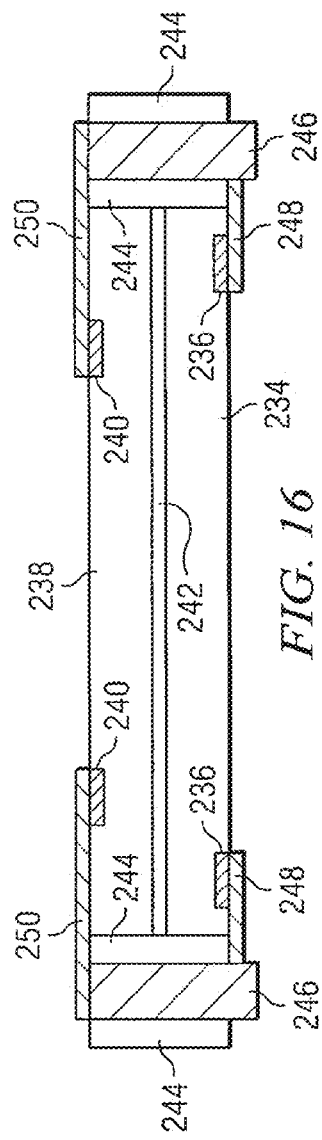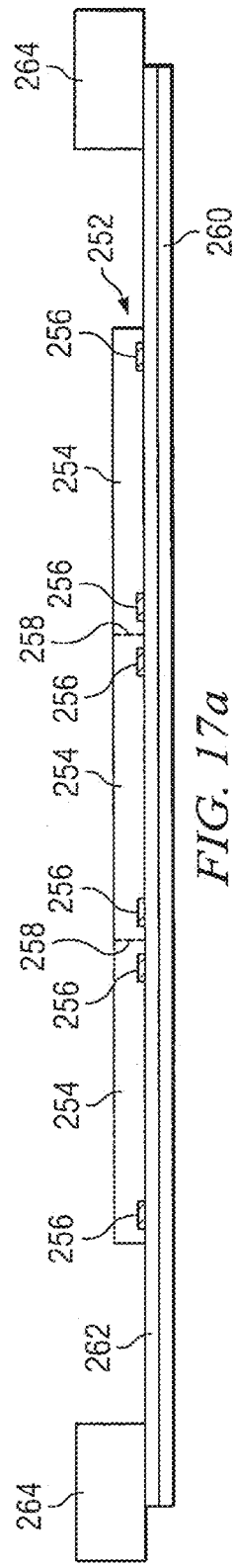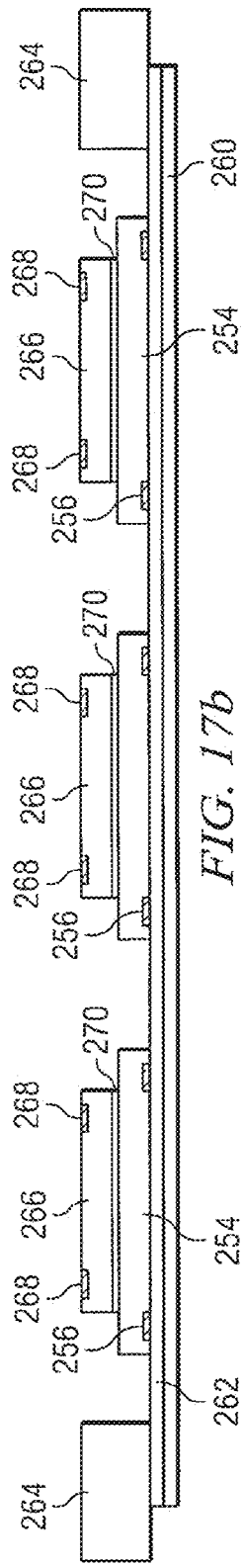

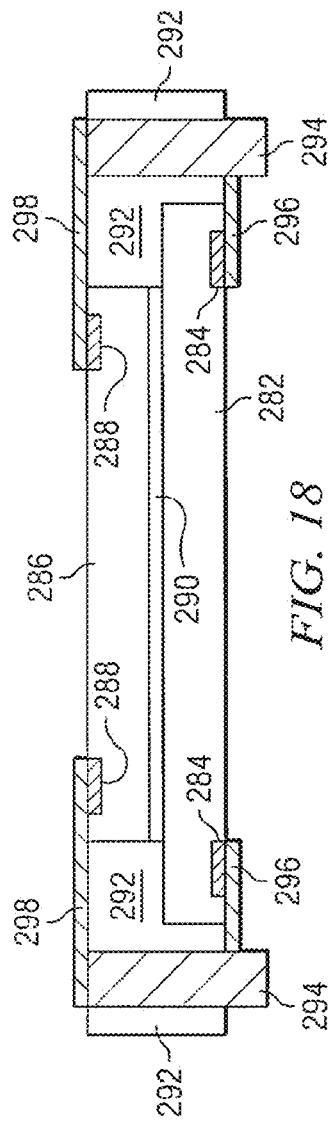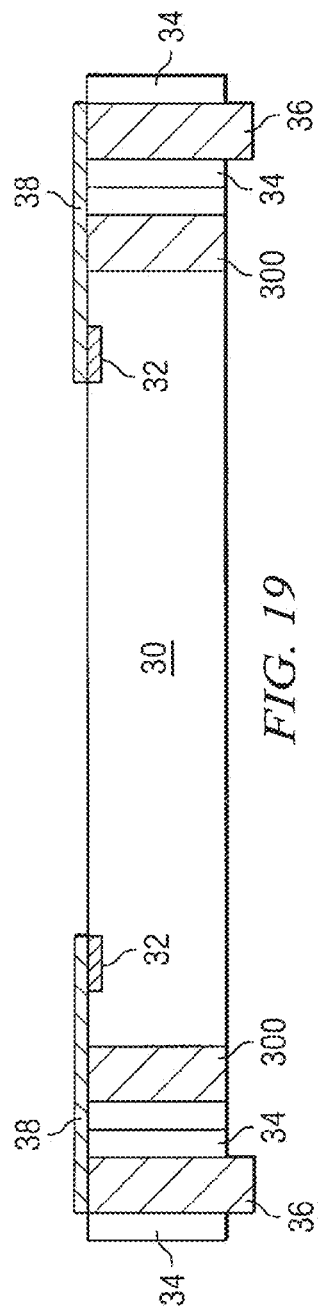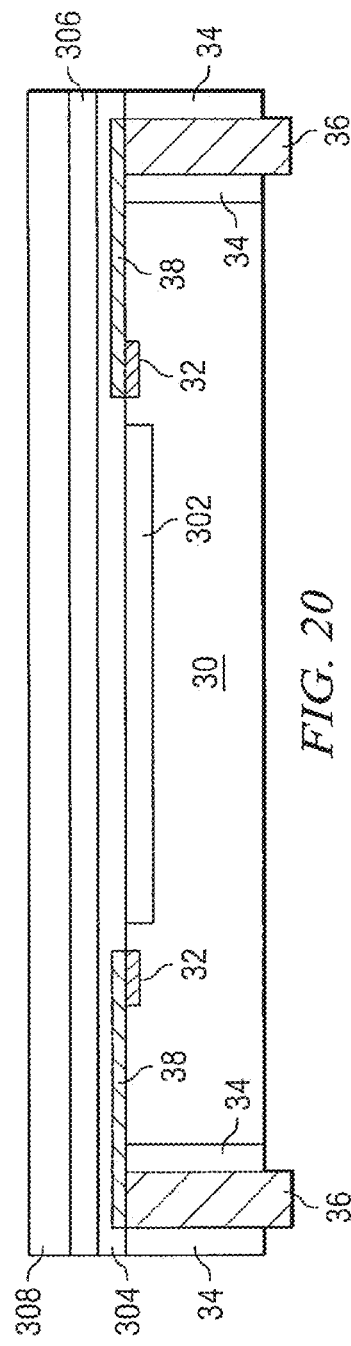

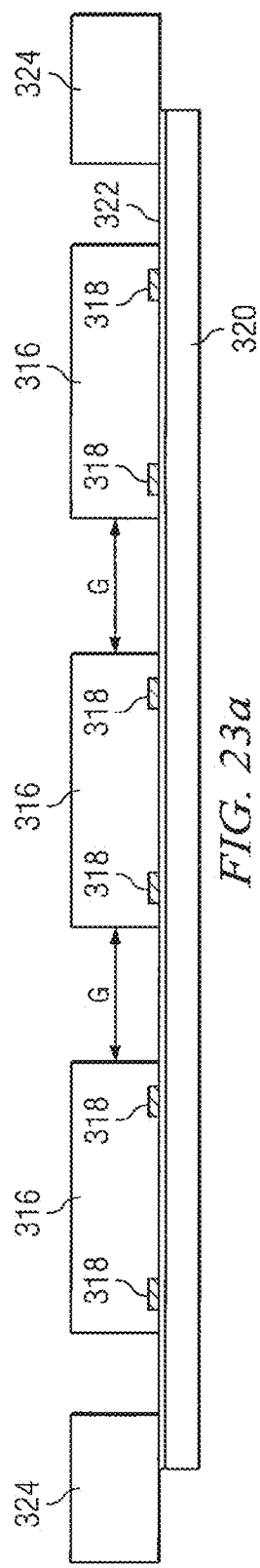
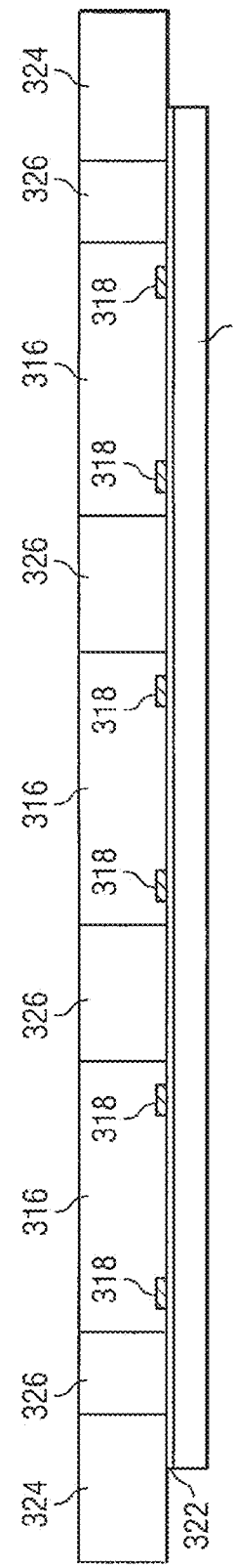
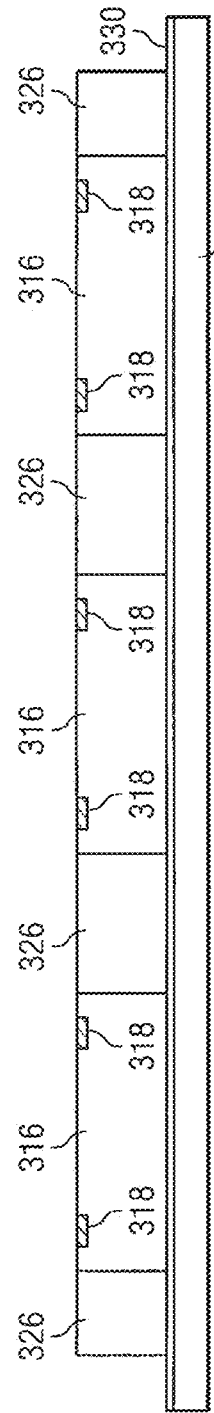
FIG. 23a
FIG. 23b
FIG. 23c

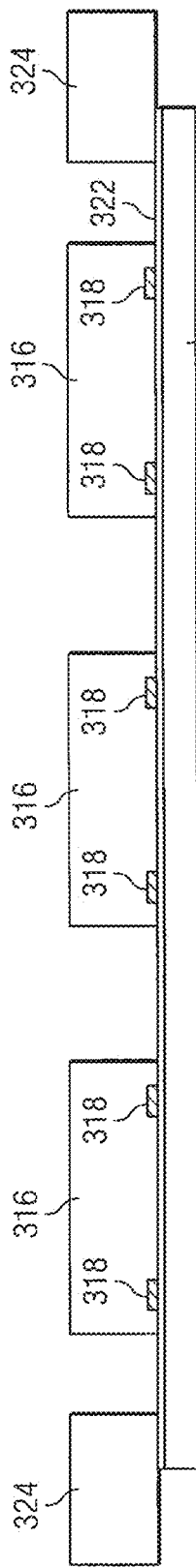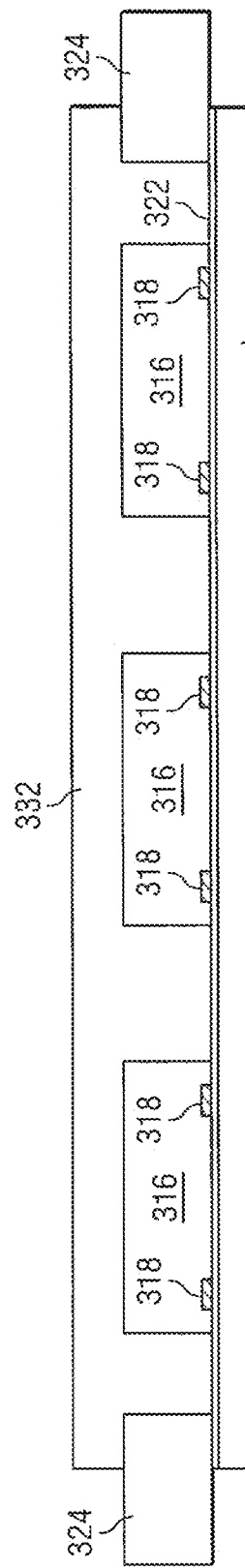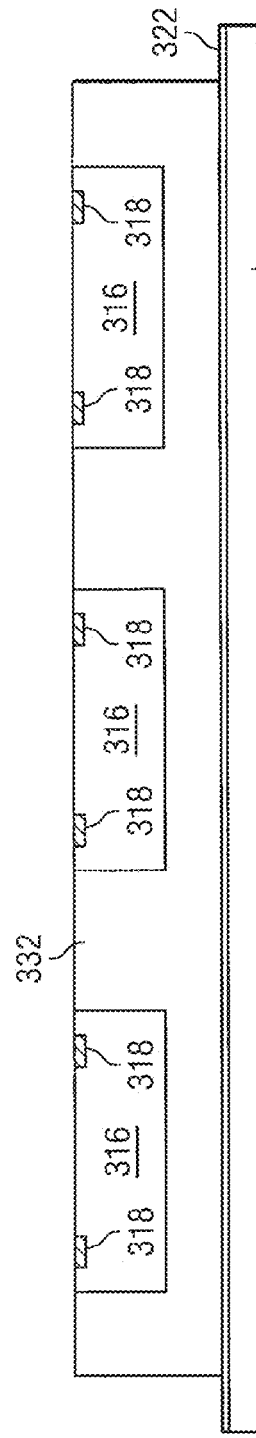

THROUGH HOLE VIAS AT SAW STREETS INCLUDING PROTRUSIONS OR RECESSES FOR INTERCONNECTION

CLAIM TO DOMESTIC PRIORITY

The present application is a division of U.S. patent application Ser. No. 12/057,199, now U.S. Pat. No. 8,072,079, filed Mar. 27, 2008, and claims priority to the foregoing parent application.

FIELD OF THE INVENTION

The present invention relates in general to semiconductor devices and, more particularly, to a semiconductor device having through hole vias formed in a saw street region of a wafer around a periphery of a die that include protrusions or recesses for interconnection.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

Semiconductor devices operate by exploiting the electrical properties of semiconductor materials. By controlling the conductivity and resistivity of semiconductor materials, electronic devices and integrated circuits are formed over a semiconductor substrate. The devices and circuits include multiple layers of semiconductor, insulator and conductive materials.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Semiconductors devices are formed in two steps referred to as front-end and back-end manufacturing.

Front-end manufacturing generally refers to formation of the semiconductor devices on the wafer. During formation of the devices, layers of a dielectric material such as silicon dioxide are deposited over the wafer. The dielectric facilitates the formation of transistors and memory devices. Metal layers are deposited over the wafer to interconnect the various semiconductor devices. The finished wafer has an active side containing the transistors and other active and passive components. After the devices are formed, they are tested in a preliminary testing step to verify the devices are operational. If a sufficiently high number of devices is discovered to contain defects, the devices or even the entire wafer may be discarded.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. In some cases, the wafer is singulated using a laser cutting device. After singulation, the individual dies are mounted to a package substrate that includes pins or contact pads for interconnection with other system components. Contact pads formed over the semiconductor die are then connected to contact pads within the package. Often, wirebonding is used to make the connection, however other connection technologies such as solder bumps or stud bumping may be used. After wirebonding, an encapsulant or other molding material is deposited over the package to provide physical support and electrical insulation. The finished package is then inserted into an electrical system and the functionality of the semiconductor is made available to the other system components.

One goal of semiconductor manufacturing is to produce a package suitable for faster, reliable, smaller, and higher-density integrated circuits (ICs) at lower cost. Flip chip packages or wafer level packages (WLP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation distance, lower capacitance, and achieve overall better circuit performance.

In many applications, it is desirable to vertically stack semiconductor die for greater device integration and minimize interconnect routing within a package. The electrical interconnection between stacked semiconductor die or packages has been done with through hole vias which traverse from the front side to the backside of the die. The through hole vias are formed by drilling through the active area of the die. However, the drilling process is disruptive and can cause damage to the wafer and/or die. Furthermore, because the through hole vias occupy a portion of the active area of the die, the functional area of the die is minimized, limiting the amount of circuitry that can be formed within the die. Finally, when interconnecting die using conventional through hole vias, the stand off height between the die is largely uncontrolled because the height of conventional via interconnection methods vary and are difficult to control.

A need exists to interconnect stacked semiconductor die using through hole vias that provide a consistent and controllable stand off height while minimizing manufacturing cost and increasing efficiency.

SUMMARY OF THE INVENTION

In one embodiment, the present invention is a method of making a semiconductor device comprising the steps of providing a first semiconductor die, depositing a first insulating material in a peripheral region of the first semiconductor die, forming a first conductive via through the first insulating material having a first surface that is non-planar with the first insulating material, providing a second semiconductor die, depositing a second insulating material in a peripheral region of the second semiconductor die, forming a second conductive via through the second insulating material having a first surface that is non-planar with the second insulating material, and stacking the first semiconductor die over the second semiconductor die to electrically connect the first conductive via to the second conductive via.

In another embodiment, the present invention is a method of making a semiconductor device comprising the steps of providing a plurality of semiconductor die having a peripheral region between the semiconductor die, depositing an insulating material in the peripheral region, and forming a conductive via through the insulating material having a protruding first surface.

In another embodiment, the present invention is a method of making a semiconductor device comprising the steps of providing a plurality of semiconductor die having a peripheral region between the semiconductor die, depositing an insulating material in the peripheral region, and forming a conductive via through the insulating material having a recessed first surface.

In another embodiment, the present invention is a method of making a semiconductor device comprising the steps of providing a semiconductor die, depositing an insulating material in a peripheral region of the semiconductor die, and forming a conductive via through the insulating material having a first surface that is non-planar with the insulating material.

BRIEF DESCRIPTION OF THE DRAWINGS

FIGS. 10a-10b illustrate semiconductor packages having THVs formed within the saw street regions of a wafer using an organic filler material, the THVs include top protrusions for package stacking;

FIGS. 12a-12b illustrate semiconductor packages having THVs formed within the saw street regions of a wafer using an organic filler material, the THVs include recesses for package stacking;

FIGS. 13a-13b illustrate semiconductor packages having THVs formed within the saw street regions of a wafer using an organic filler material, the THVs include a double recess for package stacking;

FIG. 16 illustrates a package having THVs formed in the saw street region of a wafer using an organic filler material, the package includes back-to-back stacked dies;

FIGS. 17a-17e illustrate a process of forming THVs in the saw street region of a wafer using an organic filler material to form a package, the package includes back-to-back stacked dies of different geometries;

FIG. 18 illustrates a package having THVs formed in the saw street region of a wafer using an organic filler material, the package includes back-to-back stacked dies of different sizes;

FIG. 19 illustrates a package having THVs formed in the saw street region of a wafer using an organic filler material, the package includes a through silicon via (TSV);

FIG. 20 illustrates a package having THVs formed in the saw street region of a wafer using an organic filler material, the package includes an optical device and a transparent protective layer;

FIGS. 23a-23c illustrate a first alternative process for depositing an organic material into gaps formed between a plurality of semiconductor devices; and FIGS. 24a-24c illustrate a second alternative process for depositing an organic material into gaps formed between a plurality of semiconductor devices, the organic material covers a backside of the semiconductor devices.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, physical vapor deposition (PVD), chemical vapor deposition (CVD), evaporation, and sputtering. Photolithography involves the masking of areas of the surface and etching away undesired material to form specific structures. The doping process injects concentrations of dopant material by thermal diffusion or ion implantation.

Figure 1A:
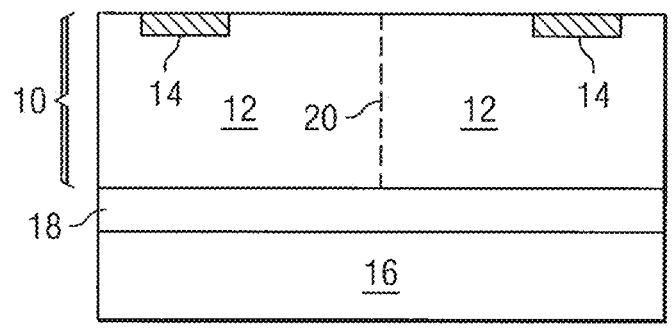
FIGS. 1a-1e illustrate a process of forming THVs in the saw street region of a wafer using an organic filler material.

FIGS. 1a-1e illustrate a process of forming through hole vias (THVs) within the saw street region of a wafer in a chip scale package (CSP) using an organic filler material. Semiconductor die are formed on or within a semiconductor wafer using conventional integrated circuit processes, as described above. As shown in FIG. 1a wafer 10 having dies 12 with contact pads 14 is deposited over expansion table 16 using adhesive 18. Wafer 10 includes a semiconductor substrate such as a silicon (Si) or other bulk semiconductor material. Dies 12 include semiconductor dies such as memory, controllers, application specific integrated circuits (ASICs), processors, microcontrollers, or combinations thereof. Contact pads 14 include a conductive material such as copper (Cu), silver (Ag), or gold (Au) and are formed over a surface of dies 12 by a PVD, CVD, electrolytic plating, or electroless plating process. Expansion table 16 includes any substrate, apparatus or other structure suitable for mounting a plurality of semiconductor die or other electronic components and creating and/or expanding gaps between each of the semiconductor die or electronic components. Adhesive 18 includes a thermal epoxy adhesive material, for example. Within wafer 10, a plurality of saw streets 20 is formed between dies 12. Saw streets or scribes 20 include non-functional regions of wafer 10 through which a saw or other cutting or routing device can penetrate to separate the individual die 12 within wafer 10.

Figure 1B:
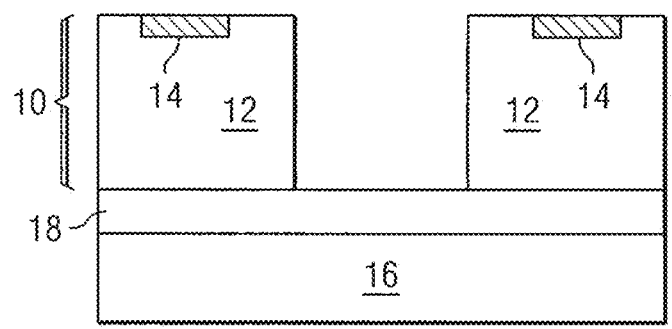

Turning to FIG. 1b, dies 12 are separated along saw streets 20 using a dicing process such as mechanical sawing or laser cutting. After dicing, expansion table 16 operates to separate dies 12 and form a gap between each one of dies 12.

Figure 1C:
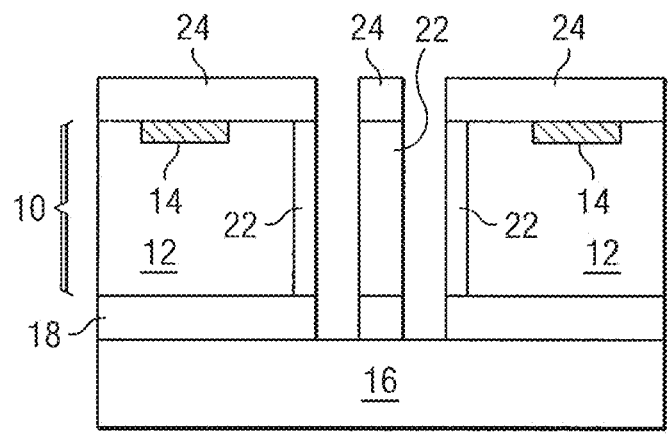

Turning to FIG. 1c, organic material 22 is deposited into the gap between dies 12 by spin-coating or needle dispensing. Organic material 22 includes benzocyclobutene (BCB), polyimide, or acrylic resin. Alternatively, organic material 22 may be replaced by other non-conductive materials such as a polymer molding compound, liquid epoxy molding, compression molding, soft laminating film, or other material having dielectric or electrical insulating properties suitable for filling the gaps between dies 12 or other semiconductor devices. Mask 24 is deposited and patterned over dies 12 and organic material 22. Mask 24 includes a photoresist material and is used to etch portions of organic material 22. With mask 24 deposited and patterned, organic material 22 is etched to form through holes. In FIG. 1c, the through holes are formed through both organic material 22 and adhesive layer 18.

Figure 1D:
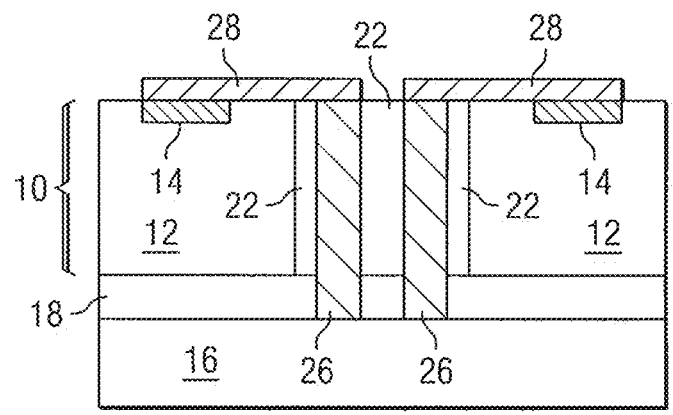

In FIG. 1d a conductive material is deposited into the through holes to form through hole vias (THVs) 26. THVs 26 may include Cu, Au, Ag, or another conductive material. Redistribution layer (RDL) 28 is deposited over dies 12 to form an electrical connection between contact pads 14 and THVs 26. RDL 28 can be made with aluminum (Al), aluminum copper alloy (AlCu), Cu, or Cu alloy. RDL 28 operates as an intermediate conduction layer to route electrical signals between THVs 26 and contact pads 14.

Figure 1E:
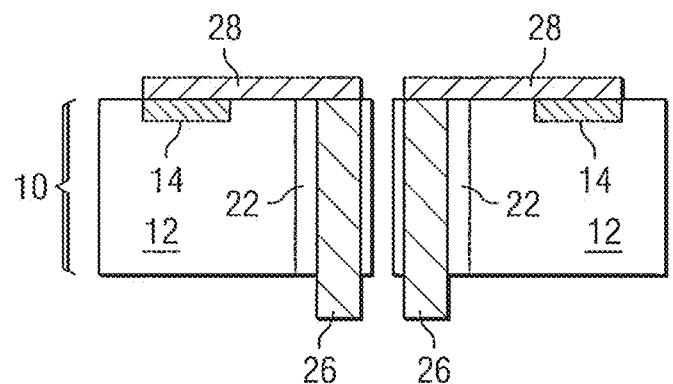

Turning to FIG. 1e, the die are singulated by cutting through organic material 22 formed between dies 12. After singulation (or, in some embodiments before singulation), expansion table 16 is removed and adhesive layer 18 is removed using a stripping process such as a wet etch, or dry etch removal process.

Using this process, semiconductor packages may be fabricated that provide both a fixed and increased stand off height when the package is mounted to another WLCSP, CSP or substrate. By providing a protruding or recessed via, the standoff height for a mounted package can be controlled. In some cases, the extra height provided by a via protrusion is used to complement stand off height provided by solder paste or bumps that are used to mount the package. Using the present method, several packages having both via protrusions and recesses can be created to facilitate the stacking of a plurality of semiconductor packages. In packages that include a via having a protrusion, the package may be mounted directly to a substrate or other device without the use of bumps or additional RDL. Also, the via protrusion eliminates the necessity of underfilling as solder bumps are not necessary to mount the package. Finally, because the vias are formed in organic or other insulative material deposited within the saw street regions of a wafer, functional circuit area of the semiconductor die can be maximized.

Packages may be fabricated with THVs that include combinations of protrusions and recesses to facilitate package stacking. In one embodiment, a package is formed with THVs that protrude from a bottom surface of the package. A second package is fabricated that includes THVs that protrude from a top surface of the package. The first package is stacked over the second and the two sets of protruding THVs are connected using a bonding process such as a direct metal bonding or an adhesive bonding process. Alternatively, a first package may be fabricated with THVs that protrude from a bottom surface of the package. A second package is fabricated with THVs that are recessed behind a top surface of the package. The first package is stacked over the second package and the protruding THVs are inserted into the recesses formed in the second package. The protruding and recessed THVs are then bonded. Using this method, many combinations of packages including THVs with either protrusions or recesses may be fabricated. The packages may then be connected by bonding recessed THVs to protruding THVs, or bonding two protruding THVs. Using these methods two or more packages may be stacked, each package including one or more protruding or recessed THVs.

Figure 2A:
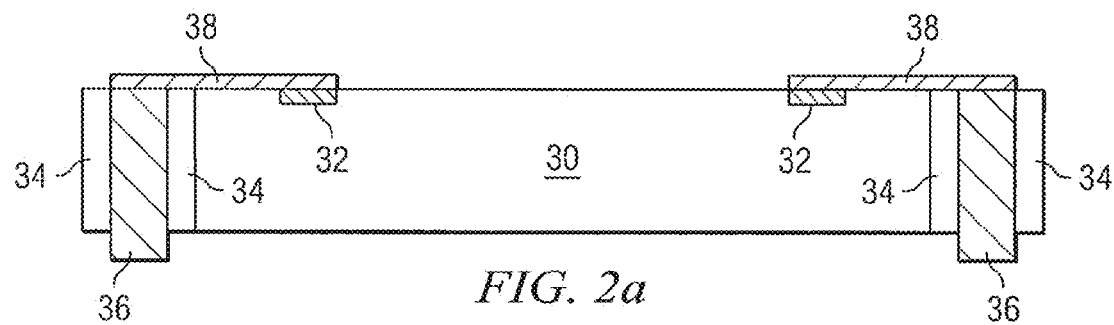
FIGS. 2a-2b illustrate a semiconductor package having THVs formed within the saw street region of a wafer and a redistribution layer (RDL) deposited over the package.

FIG. 2a shows a semiconductor package having THVs formed within the saw street of a wafer and an RDL deposited over the package. In FIG. 2a, a side view of the package is shown taken along the plane 2a of FIG. 2b. Die 30 having contact pads 32 is formed within a wafer. The wafer is diced and the individual die of the wafer are separated using an expansion table. Organic material 34 is deposited into the gaps formed between the individual dies. Organic material 34 is etched using a photolithography or other etching process to form vias into which a conductive material is deposited to form THVs 36. THVs 36 protrude past a bottom surface of die 30. RDL 38 is deposited over the device to form an electrical connection between contact pads 32 of die 30 and THVs 36.

Figure 2B:
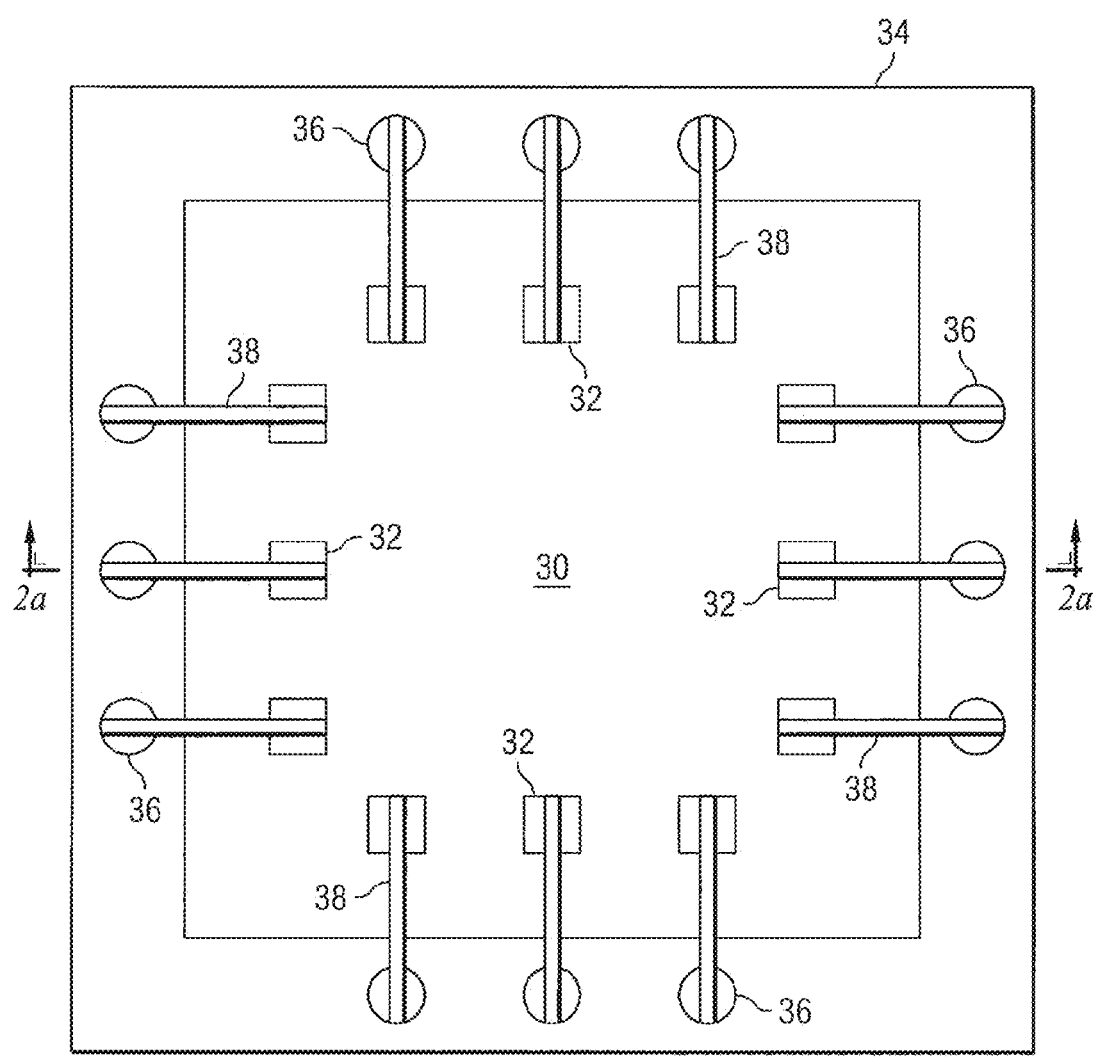

FIG. 2b shows a top view of the semiconductor package. The package includes die 30 having contact pads 32. Organic material 34 is deposited into gaps formed between the plurality of dies of the wafer. Holes are etched into organic material 34 into which a conductive material is deposited to form THVs 36. RDL 38 is deposited over the package to connect contact pads 32 of die 30 and THVs 36.

Figure 3A:
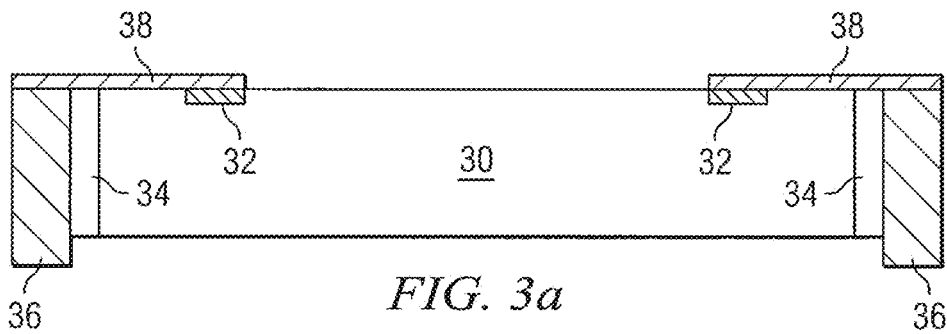
FIGS. 3a-3b illustrate a semiconductor package having THVs formed at the outer edges of an organic filler material.

FIG. 3a shows a semiconductor package having THVs formed at the outer edges of an organic filler material. In FIG. 3a a side view of the package is shown taken along the plane 3a of FIG. 3b. Die 30 having contact pads 32 is formed within a wafer. The wafer is diced and the individual die of the wafer are separated using an expansion table. Organic material 34 is deposited into the gaps formed between the individual dies. Organic material 34 is etched using a photolithography or other etching process to form vias. The vias are formed in a perimeter of organic material 34. In alternative embodiments, the vias may include full or half vias, or a combination of vias having different widths, depths, and/or shapes. A conductive material is deposited into the plurality of holes formed in organic material 34 to form THVs 36. THVs 36 protrude past a bottom surface of die 30. RDL 38 is deposited over the device to form an electrical connection between contact pads 32 of die 30 and THVs 36.

Figure 3B:
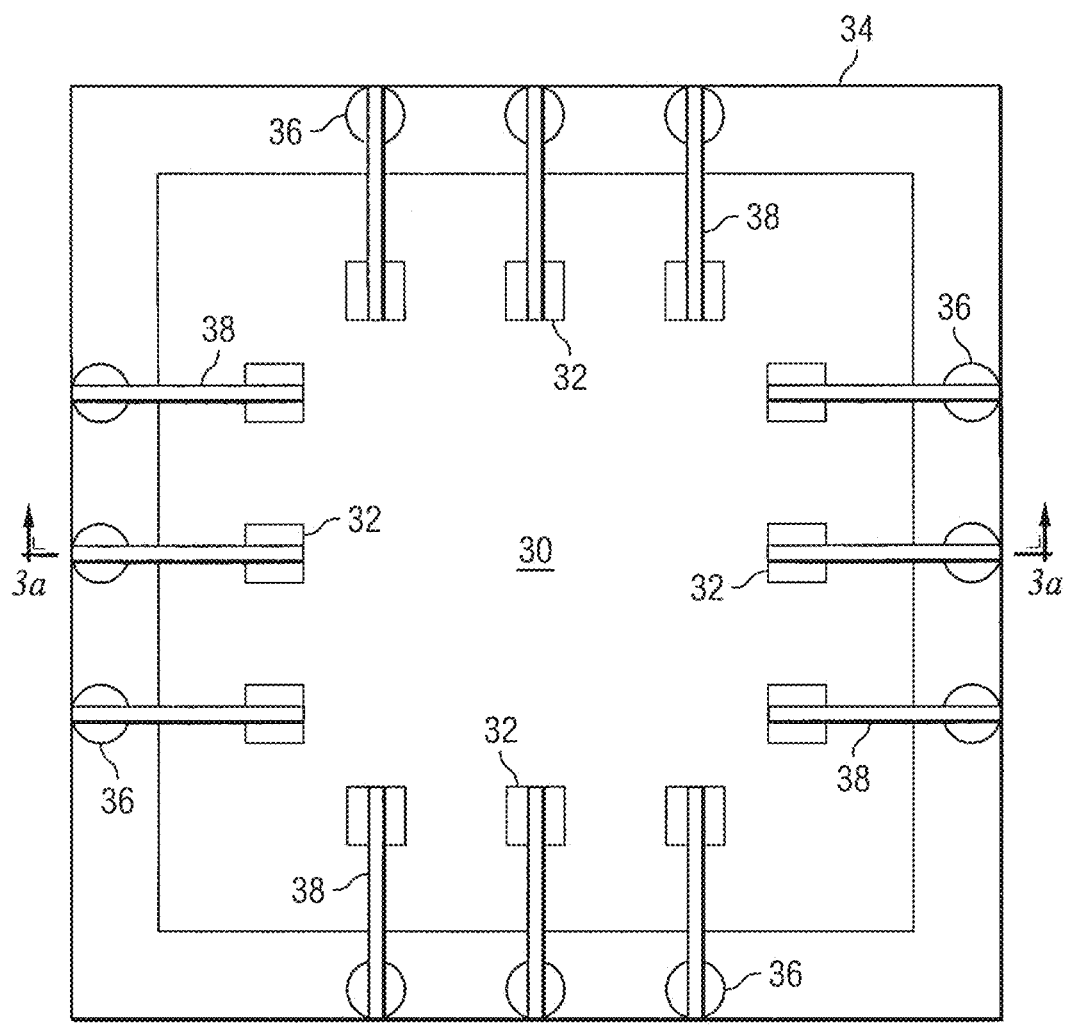

FIG. 3b shows a top view of the semiconductor package. The package includes die 30 having contact pads 32. Organic material 34 is deposited into gaps formed between the plurality of dies of the wafer. Holes or vias are etched into organic material 34 into a perimeter of organic material 34. A conductive material is deposited into the plurality of holes to form THVs 36. RDL 38 is deposited over the package to connect contact pads 32 of die 30 and THVs 36.

Figure 4A:
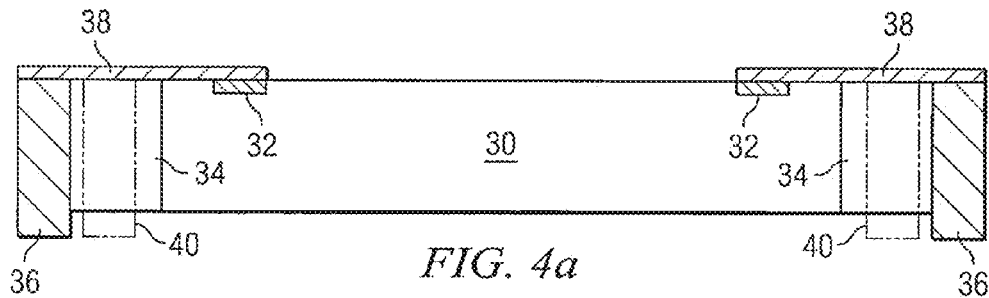
FIGS. 4a-4b illustrate a semiconductor package having a combination of corner and multiple-row THVs including half-vias formed in the saw street region of a wafer using an organic filler material.

FIG. 4a shows a semiconductor package having a combination of corner and multiple-row THVs including half-vias formed in the saw street of a wafer using an organic filler material. In FIG. 4a, a side view of the package is shown taken along the plane 4a of FIG. 4b. Die 30 having contact pads 32 is formed within a wafer. The wafer is diced and the individual die of the wafer are separated using an expansion table. Organic material 34 is deposited into the gaps formed between the individual dies. Organic material 34 is etched using a photolithography or other etching process to form vias. The vias are distributed about an inner and outer area of organic material 34. A conductive material is deposited into the plurality of vias to form THVs 36 and 40. THVs 36 and 40 protrude past a bottom surface of die 30. RDL 38 is deposited over the device to form an electrical connection between contact pads 32 of die 30 and THVs 36 and 40.

Figure 4B:
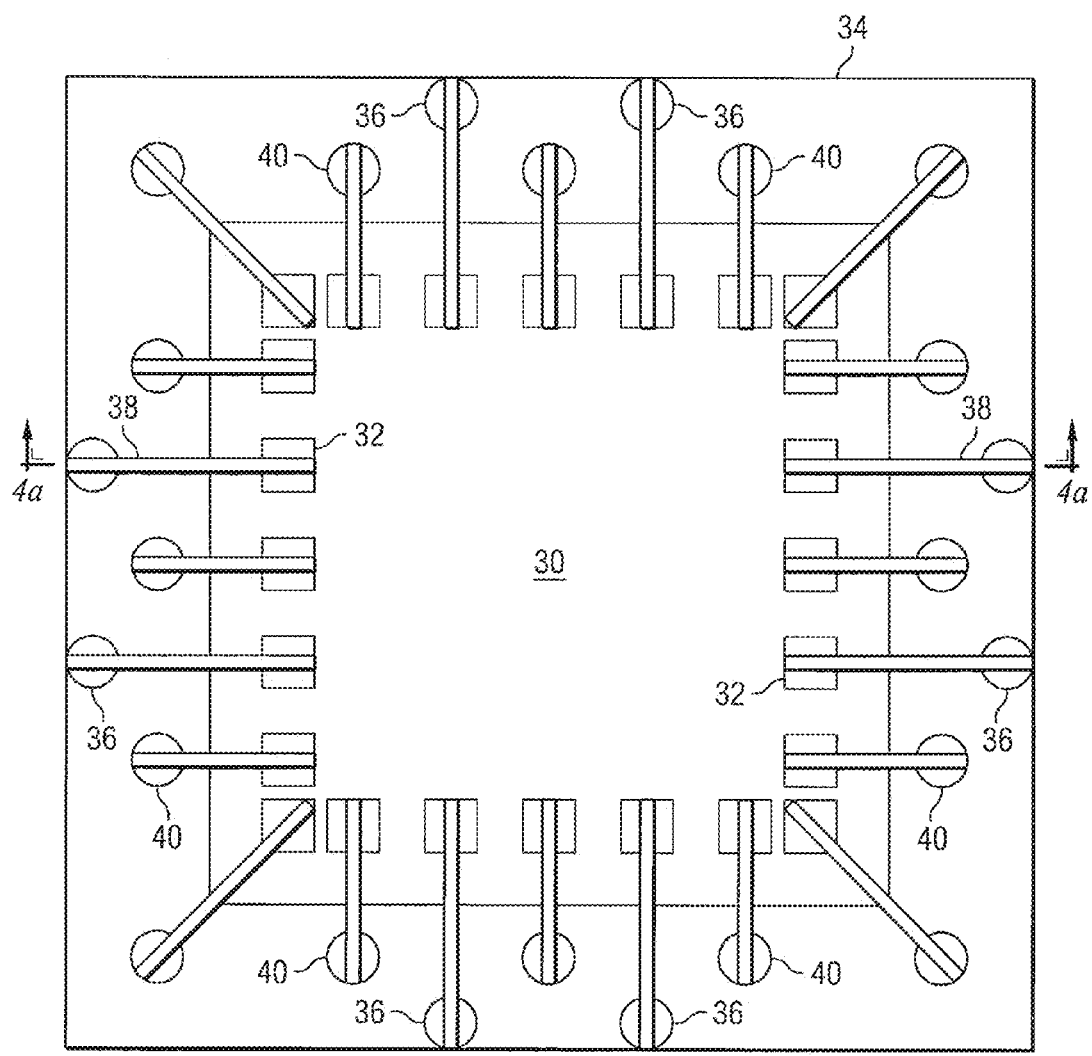

FIG. 4b shows a top view of the semiconductor package. The package includes die 30 having contact pads 32. Organic material 34 is deposited into gaps formed between the plurality of dies of the wafer. Holes are etched into organic material 34 into which a conductive material is deposited to form THVs 36 and 40. RDL 38 is deposited over the package to connect contact pads 32 of die 30 and THVs 36 and 40.

Figure 5:
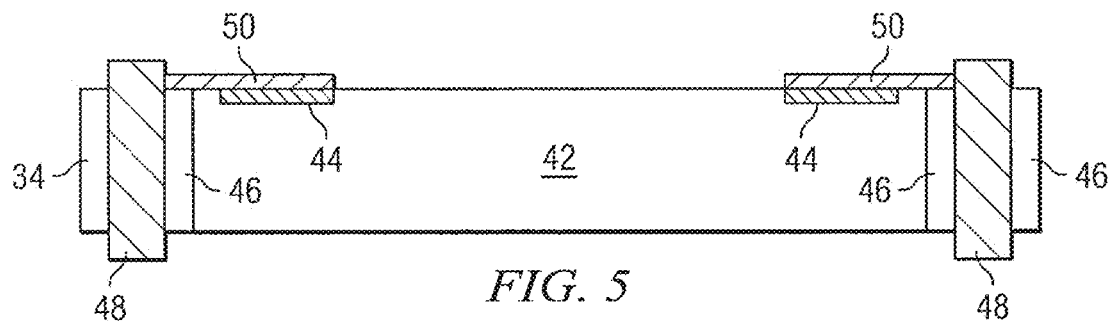
FIG. 5 illustrates a semiconductor package including THVs formed in the saw street region of a wafer, the THVs include top and bottom protrusions.

FIG. 5 shows a semiconductor package including THVs formed in the saw street of a wafer, the THVs include protrusions for package interconnection. Die 42 having contact pads 44 is formed within a wafer. The wafer is diced and the individual die of the wafer are separated using an expansion table or other suitable expansion substrate or apparatus. Organic material 46 is deposited into the gaps formed between the individual dies. Organic material 46 is etched using a photolithography or other etching process to form vias into which a conductive material is deposited to form THVs 48. The conductive material is deposited to form a protrusion at both a top portion and a bottom portion of THVs 48. The protrusions at both the top side and bottom side of the device facilitate interconnection with other system components and provide a predictable stand off height. RDL 50 is deposited over the device to form an electrical connection between contact pads 44 of die 42 and THVs 48.

Figure 6:
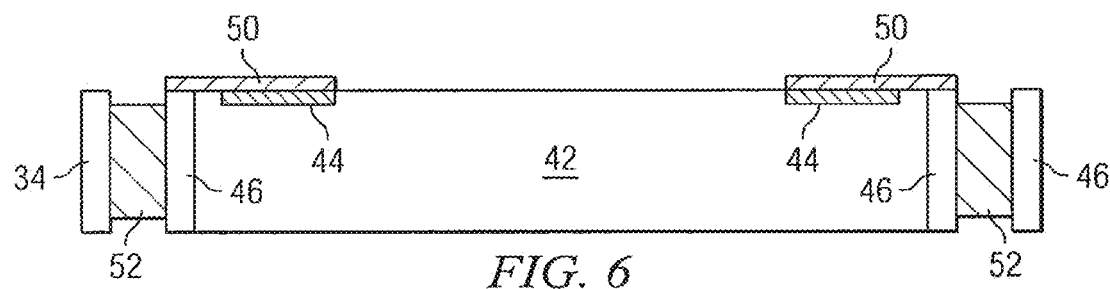
FIG. 6 illustrates a semiconductor package including THVs formed in the saw street region of a wafer, the THVs include top and bottom recesses.

FIG. 6 shows a semiconductor package including THVs formed in the saw street of a wafer, the THVs include recesses for package interconnection. Die 42 having contact pads 44 is formed within a wafer. The wafer is diced and the individual die of the wafer are separated using an expansion table or other suitable expansion substrate or apparatus. Organic material 46 is deposited into the gaps formed between the individual dies. Organic material 46 is etched using a photolithography or other etching process to form vias into which a conductive material is deposited to form THVs 52. The conductive material is deposited to form a recess at both a top portion and a bottom portion of THVs 52. The recesses at both the top side and bottom side of the device facilitate interconnection with other system components by providing a reception point for protrusions formed within other packages, or other protruding connection technologies such as leads, bumps, or studs. RDL 50 is deposited over the device to form an electrical connection with contact pads 44 of die 42.

Figure 7:
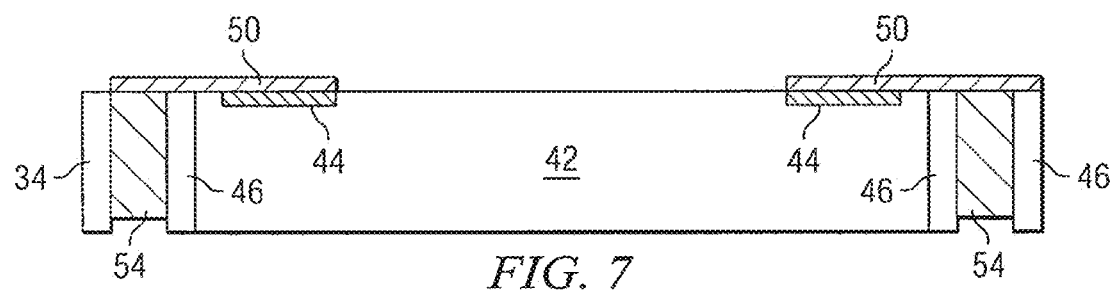
FIG. 7 illustrates a semiconductor package including THVs formed in the saw street region of a wafer, the THVs include a bottom recess.

FIG. 7 shows a semiconductor package including THVs formed in the saw street of a wafer, the THVs include recesses for package interconnection. Die 42 having contact pads 44 is formed within a wafer. The wafer is diced and the individual die of the wafer are separated using an expansion table or other suitable expansion substrate or apparatus. Organic material 46 is deposited into the gaps formed between the individual dies. Organic material 46 is etched using a photolithography or other etching process to form vias into which a conductive material is deposited to form THVs 54. The conductive material is deposited to form a recess at a bottom portion of THVs 54. The recess at the bottom side of the device facilitates interconnection with other system components by providing a reception point for protrusions formed within other packages, or other protruding connection technologies such as leads, bumps, or studs. RDL 50 is deposited over the device to form an electrical connection between contact pads 44 of die 42 and THVs 54.

Figure 8A:
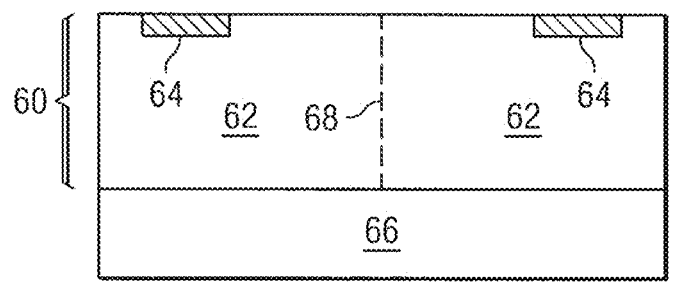
FIGS. 8a-8f illustrate a process of forming THVs in the saw street region of a wafer using an organic filler material, the THVs include top protrusions.

FIGS. 8a-8f illustrate a process of forming THVs in the saw street region of a wafer using an organic filler material, the THVs include top protrusions. Semiconductor die are formed on or within a semiconductor wafer using conventional integrated circuit processes, as described above. As shown in FIG. 8a wafer 60 having dies 62 with contact pads 64 is deposited over expansion table 66 using a layer of adhesive (not shown). The adhesive layer may include a thin layer of epoxy material. Wafer 60 includes a semiconductor substrate such as a Si or other bulk semiconductor material. Dies 62 may include semiconductor dies such as memory, controllers, ASICs, processors, microcontrollers, or combinations thereof. Contact pads 64 include a conductive material such as Cu, Ag, or Au and are formed over a surface of dies 62 by a PVD, CVD, electrolytic plating, or electroless plating process. Expansion table 66 includes any substrate, apparatus or other structure suitable for mounting a plurality of semiconductor die or other electronic components and creating and/or expanding gaps between each of the semiconductor die or electronic components. Within wafer 60, a plurality of saw streets 68 is formed between dies 62. Saw streets or scribes 68 include non-functional regions of wafer 60 through which a saw or other cutting or routing device can penetrate to separate the individual die 62 within wafer 60.

Figure 8B:
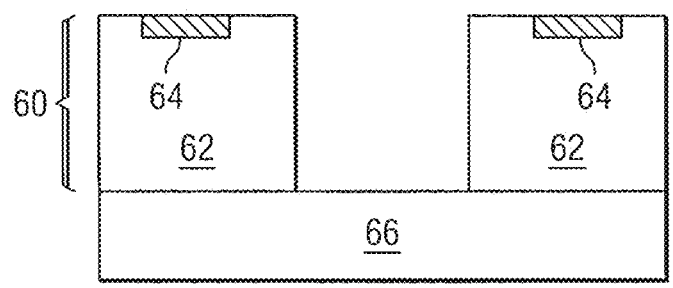

Turning to FIG. 8b, dies 62 are separated along saw streets 68 using a dicing process. After dicing, expansion table 66 operates to separate dies 62 and form a gap between each one of dies 62.

Figure 8C:
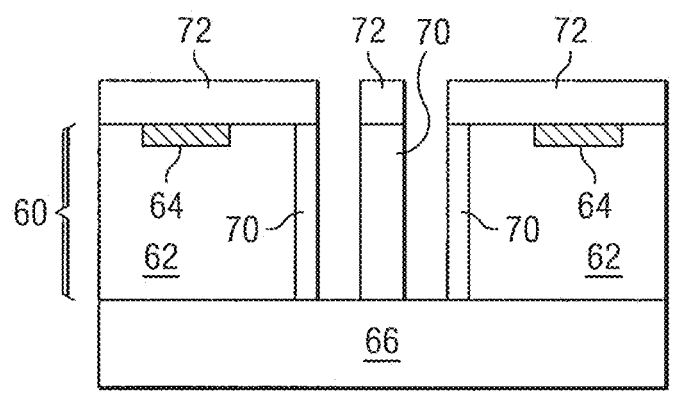

Turning to FIG. 8c, organic material 70 is deposited into the gap between dies 62 by spin-coating or needle dispensing. Organic material 70 includes BCB, polyimide, or acrylic resin. Mask 72 is deposited and patterned over dies 62 and organic material 70. Mask 72 includes a photoresist material and is used to etch portions of organic material 70. With mask 72 deposited and patterned, organic material 70 is etched to form through holes.

Figure 8D:
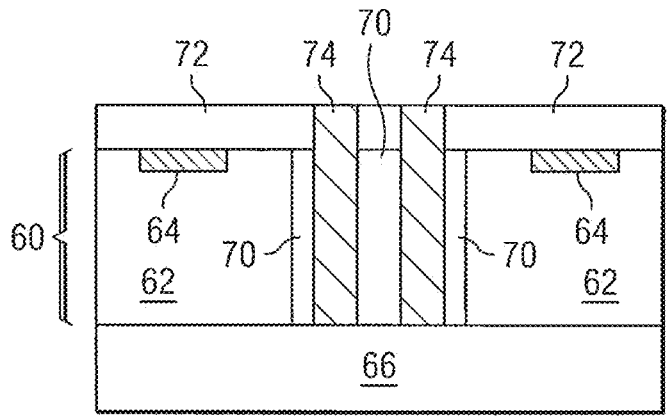

In FIG. 8d a conductive material is deposited into the through holes to form THVs 74. THVs 74 may include Cu, Au, Ag, or another conductive material. The conductive material is deposited so that a top surface of THVs 74 is approximately level or coplanar with a top surface of mask 72.

Figure 8E:
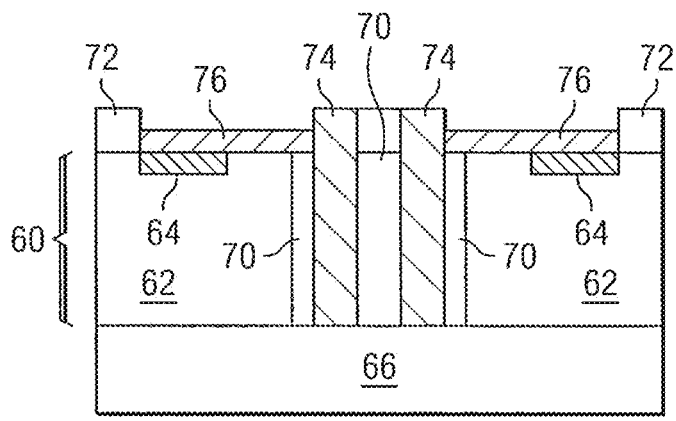

Turning to FIG. 8e, mask 72 is re-patterned to remove a portion of mask 72 deposited over contact pads 64 of dies 62. RDL 76 is deposited over dies 62 to form an electrical connection between contact pads 64 and THVs 74. RDL 76 can be made with Al, AlCu, Cu, or Cu alloy. RDL 76 operates as an intermediate conduction layer to route electrical signals between THVs 74 and contact pads 64.

Figure 8F:
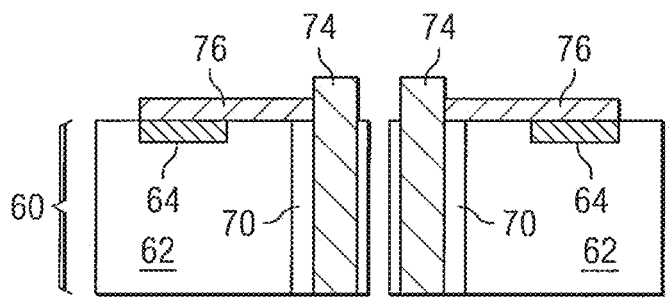

Turning to FIG. 8f, the die are singulated by cutting through organic material 70 formed between dies 62. After singulation (or, in some embodiments before singulation), expansion table 66 is removed and the adhesive layer is removed using a stripping process such as a wet etch, or dry etch removal process.

Figure 9A:
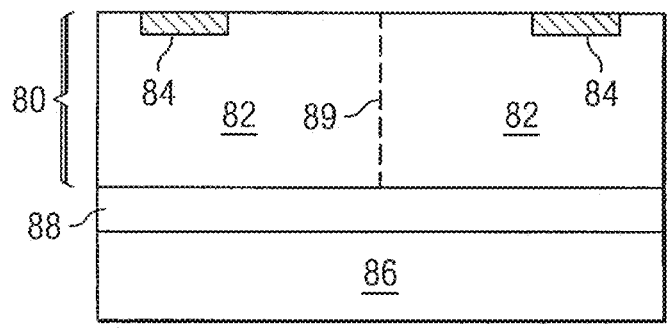
FIGS. 9a-9f illustrate a process of forming THVs in the saw street region of a wafer using an organic filler material, the THVs include both recesses and protrusions.

FIGS. 9a-9f illustrate a process of forming THVs in the saw street region of a wafer using an organic filler material, the THVs include both recesses and protrusions. Semiconductor die are formed on or within a semiconductor wafer using conventional integrated circuit processes, as described above. As shown in FIG. 9a wafer 80 having dies 82 with contact pads 84 is deposited over expansion table 86 using adhesive layer 88. Generally, the adhesive layer includes a thin layer of epoxy material. Wafer 80 includes a semiconductor substrate such as a Si or other bulk semiconductor material. Contact pads 84 include a conductive material and are formed over a surface of dies 82 using a PVD, CVD, electrolytic plating, or electroless plating process. Expansion table 86 includes any substrate, apparatus or other structure suitable for mounting a plurality of semiconductor die or other electronic components and creating and/or expanding gaps between each of the semiconductor die or electronic components. Within wafer 80, a plurality of saw streets 89 is formed between dies 82. Saw streets or scribes 89 include non-functional regions of wafer 80 through which a saw or other cutting or routing device can penetrate to separate the individual die 82 within wafer 80.

Figure 9B:
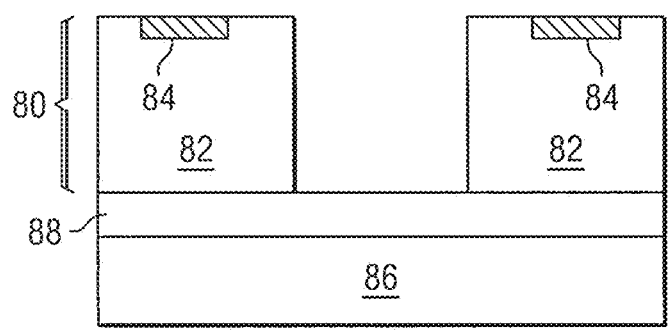

Turning to FIG. 9b, dies 82 are separated along saw streets 89 using a dicing process. After dicing, expansion table 86 operates to separate dies 82 and form a gap between each one of dies 82.

Figure 9C:
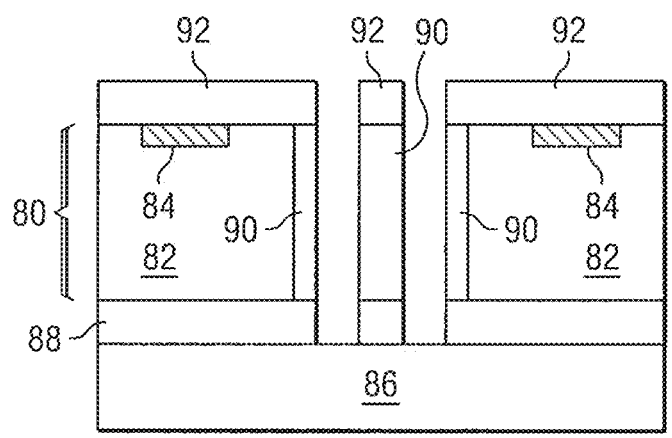

Turning to FIG. 9c, organic material 90 is deposited into the gap between dies 82 by spin-coating or needle dispensing. Organic material 90 includes BCB, polyimide, or acrylic resin. Mask 92 is deposited and patterned over dies 82 and organic material 90. Mask 92 includes a photoresist material and is used to etch portions of organic material 90. With mask 92 deposited and patterned, organic material 90 is etched to form through holes. In the present embodiment, the through holes are formed through adhesive layer 88.

Figure 9D:
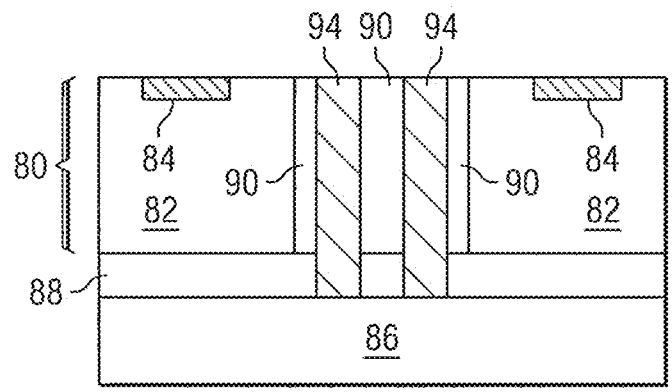

In FIG. 9d a conductive material is deposited into the through holes to form THVs 94. THVs 94 may include Cu, Au, Ag, or another conductive material. The conductive material is deposited so that a top surface of THVs 94 is approximately level or coplanar with a top surface of organic material 90. A bottom surface of THVs 94 is formed approximately coplanar with a surface of expansion table 86. After deposition of THVs 94, mask 92 is removed via an etching or other removal process. In an alternative embodiment, a chemical-mechanical planarization (CMP) process may be used to planarize the top surface of the package, for example to make a top surface of THVs 94 approximately coplanar with a top surface of dies 82.

Figure 9E:
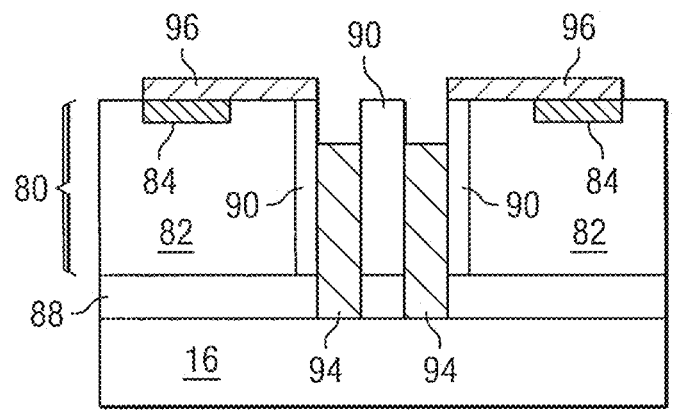

Turning to FIG. 9e, THVs 94 are etched to form recesses. THVs 94 may be etched using a laser drilling or other etching process. RDL 96 is deposited over dies 82 to form an electrical connection with contact pads 84. RDL 96 includes a conductive material and operates as an intermediate conduction layer to route electrical signals.

Figure 9F:
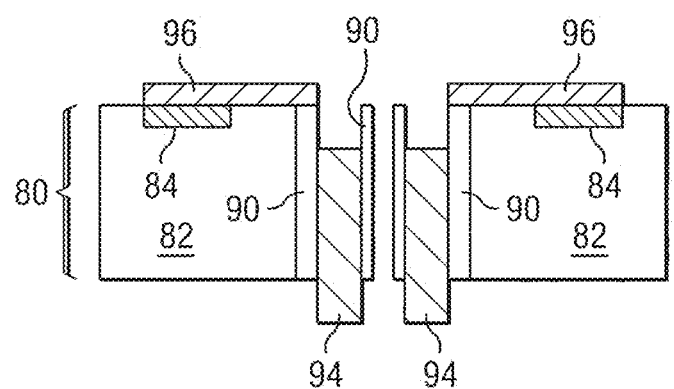

Turning to FIG. 9f, the die are singulated by cutting through organic material 90 formed between dies 82. After singulation (or, in some embodiments before singulation), expansion table 86 is removed and adhesive layer 88 is removed using a stripping process such as a wet etch, or dry etch removal process.

FIGS. 10a-10b illustrate two semiconductor packages having THVs formed within the saw streets of a wafer using an organic filler material, the THVs include top protrusions for package stacking. In FIG. 10a, package 100 includes die 102 having contact pads 104. Organic material 106 is deposited around a periphery of die 102. Through holes are formed in organic material 106 and a conductive material is deposited into the holes to form THVs 108. A top surface of THVs 108 is approximately coplanar with a top surface of die 102. A bottom surface of THVs 108 protrudes past a bottom surface of die 102. RDL 110 is deposited over die 102 to form an electrical connection between contact pads 104 and THVs 108.

Package 112 includes inverted die 114 having contact pads 116. Organic material 118 is deposited around a periphery of die 114. Through holes are formed in organic material 118 and a conductive material is deposited into the holes to form THVs 120. A top surface of THVs 120 is approximately coplanar with a top surface (the surface proximate to contact pads 116) of die 114. A bottom surface of THVs 120 protrudes past a bottom surface (the surface opposite contact pads 116) of die 114. RDL 122 is deposited over die 114 to form an electrical connection between contact pads 116 and THVs 120.

Turning to FIG. 10b, the two packages are connected. THVs 108 and 120 are joined to electrically interconnect dies 102 and 114. THVs 108 and 120 are connected using direct metal bonding, adhesive bonding, solder paste connections, or another connection process. The bonding process may form bumps 124 at the connection point.

Figure 11A:
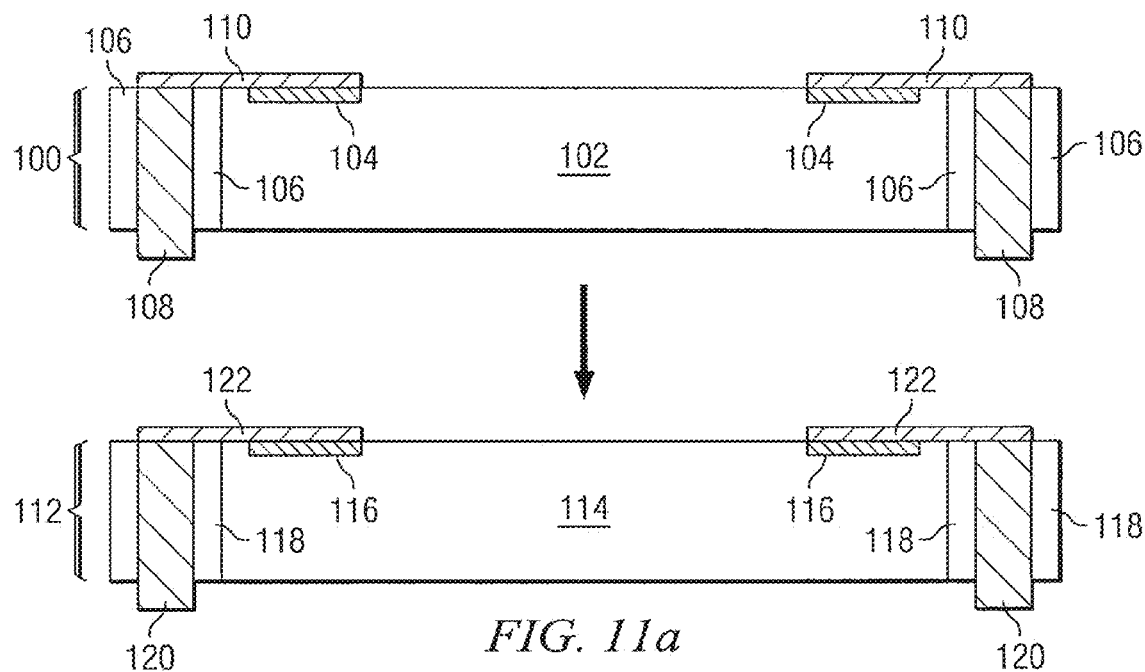
FIGS. 11a-11b illustrate semiconductor packages having THVs formed within the saw street regions of a wafer using an organic filler material, the THVs include protrusions for flat package stacking.
Figure 11B:
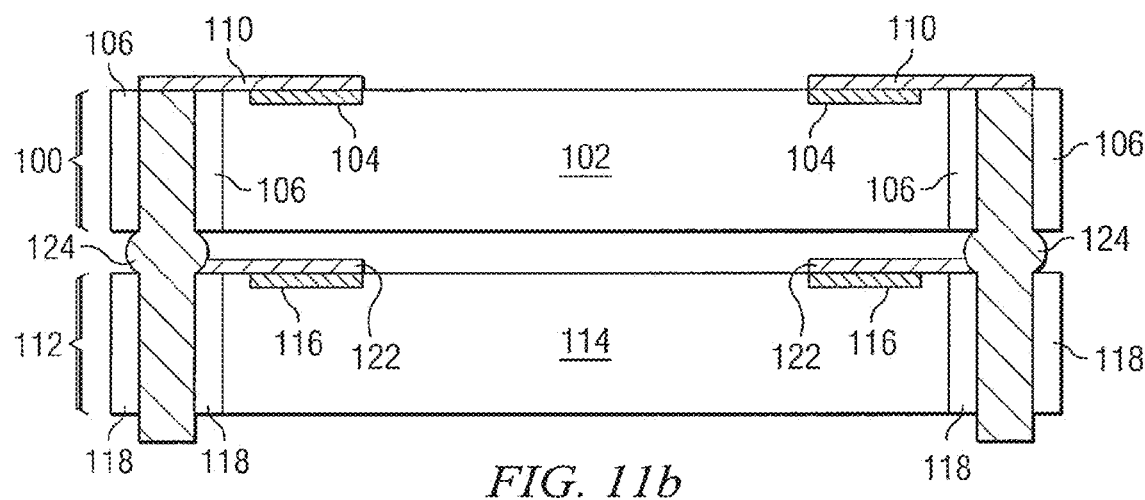

FIGS. 11a-11b illustrate semiconductor packages having THVs formed within the saw streets of a wafer using an organic filler material, the THVs include protrusions for package stacking. In FIG. 11a, package 100 includes die 102 having contact pads 104. Organic material 106 is deposited around a periphery of die 102. Through holes are formed in organic material 106 and a conductive material is deposited into the holes to form THVs 108. A top surface of THVs 108 is approximately coplanar with a top surface of die 102. A bottom surface of THVs 108 protrudes past a bottom surface of die 102. RDL 110 is deposited over die 102 to form an electrical connection between contact pads 104 and THVs 108.

Package 112 includes die 114 having contact pads 116. Organic material 118 is deposited around a periphery of die 114. Through holes are formed in organic material 118 and a conductive material is deposited into the holes to form THVs 120. A top surface of THVs 120 is approximately coplanar with a top surface of die 114. A bottom surface of THVs 120 protrudes past a bottom surface of die 114. RDL 122 is deposited over die 114 to form an electrical connection between contact pads 116 and THVs 120.

Turning to FIG. 11b, the two packages are connected. THVs 108 of package 100 are joined to RDL 122 of package 112 to electrically interconnect dies 102 and 114. THVs 108 and RDL 122 are connected using direct metal bonding, adhesive bonding, solder paste connections, or another connection process.

FIGS. 12a-12b illustrate semiconductor packages having THVs formed within the saw streets of a wafer using an organic filler material, the THVs include recesses for package stacking. In FIG. 12a, package 130 includes die 132 having contact pads 134. Organic material 136 is deposited around a periphery of die 132. Through holes are formed in organic material 136 and a conductive material is deposited into the holes to form THVs 138. A top surface of THVs 138 is approximately coplanar with a top surface of die 132. A bottom surface of THVs 138 protrudes past a bottom surface of die 132. RDL 140 is deposited over die 132 to form an electrical connection between contact pads 134 and THVs 138.

Package 142 includes die 144 having contact pads 146. Organic material 148 is deposited around a periphery of die 144. Through holes are formed in organic material 148 and a conductive material is deposited into the holes to form THVs 150. A top surface of THVs 150 (level with contact pads 146) is approximately coplanar with a top surface of die 144. A bottom surface of THVs 150 is recessed behind a bottom surface of die 144. RDL 152 is deposited over die 144 to form an electrical connection between contact pads 146 and THVs 150.

Turning to FIG. 12b, the two packages are connected. THVs 138 of package 130 are joined to THVs 150 of package 142 to electrically interconnect dies 132 and 144. THVs 138 and 150 are connected using direct metal bonding, adhesive bonding, solder paste connections, or another connection process.

FIGS. 13a-13b illustrate semiconductor packages having THVs formed within the saw streets of a wafer using an organic filler material, the THVs include a double recess for package stacking. In FIG. 13a, package 154 includes die 156 having contact pads 158. Organic material 160 is deposited around a periphery of die 156. Through holes are formed in organic material 160 and a conductive material is deposited into the holes to form THVs 162. A top surface of THVs 162 is approximately coplanar with a top surface of die 156. A bottom surface of THVs 162 protrudes past a bottom surface of die 156. RDL 164 is deposited over die 156 to form an electrical connection between contact pads 158 and THVs 162.

Package 166 includes die 168 having contact pads 170. Organic material 172 is deposited around a periphery of die 168. Through holes are formed in organic material 172 and a conductive material is deposited into the holes to form THVs 174. A top surface of THVs 174 is recessed behind a top surface of die 168 by a suitable etching process. A bottom surface of THVs 174 is recessed behind a bottom surface of die 168. RDL 176 is deposited over die 168 to form an electrical connection with contact pads 170.

Package 178 includes die 180 having contact pads 182. Organic material 184 is deposited around a periphery of die 180. Through holes are formed in organic material 184 and a conductive material is deposited into the holes to form THVs 186. A top surface of THVs 186 protrudes past a top surface of die 180. A bottom surface of THVs 186 is approximately coplanar with a bottom surface of die 180. RDL 188 is deposited over die 180 to form an electrical connection between contact pads 182 and THVs 186.

Turning to FIG. 13b, the three packages are connected. THVs 162 of package 154 are joined to THVs 174 of package 166 to electrically interconnect dies 156 and 168. THVs 174 of package 166 are joined to THVs 186 of package 178 to electrically interconnect dies 168 and 180. THVs 162, 174, and 186 are connected using direct metal bonding, adhesive bonding, solder paste connections, or another connection process.

Figure 14A:
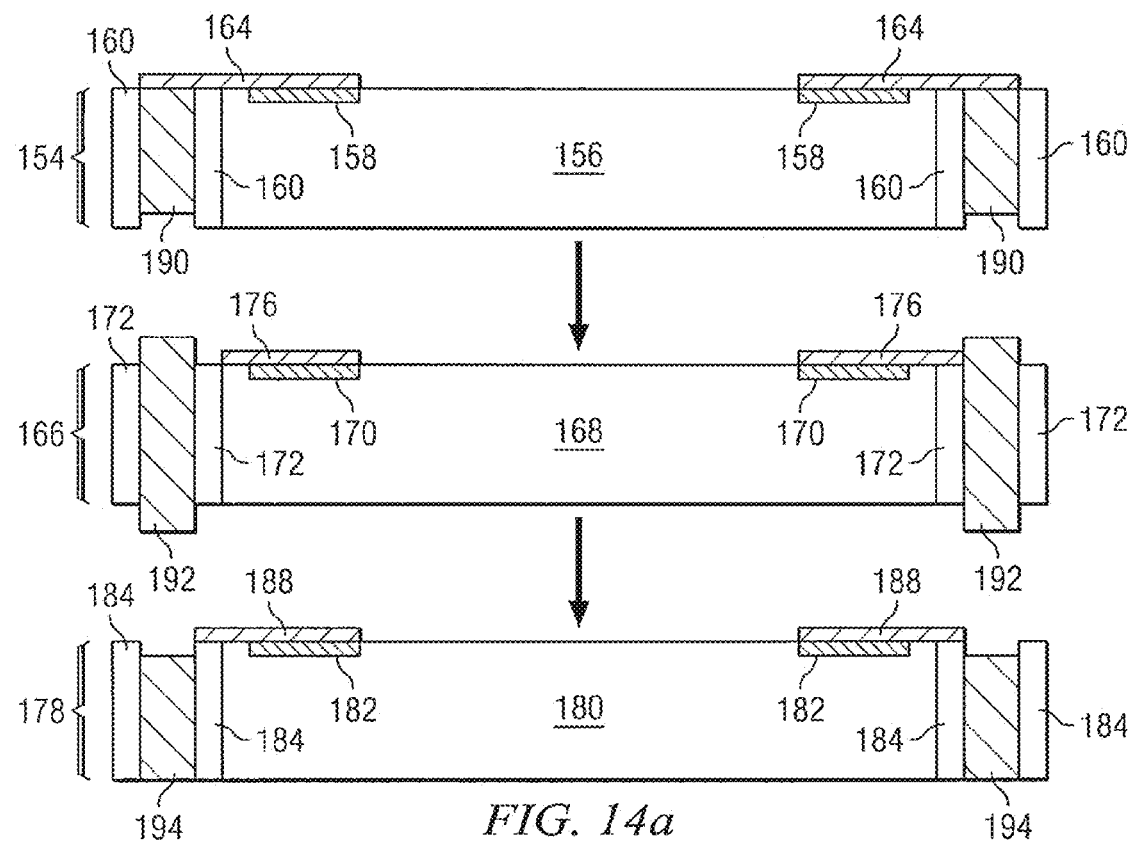
FIGS. 14a-14b illustrate semiconductor packages having THVs formed within the saw street regions of a wafer using an organic filler material, the THVs include a double protrusion for package stacking.
Figure 14B:
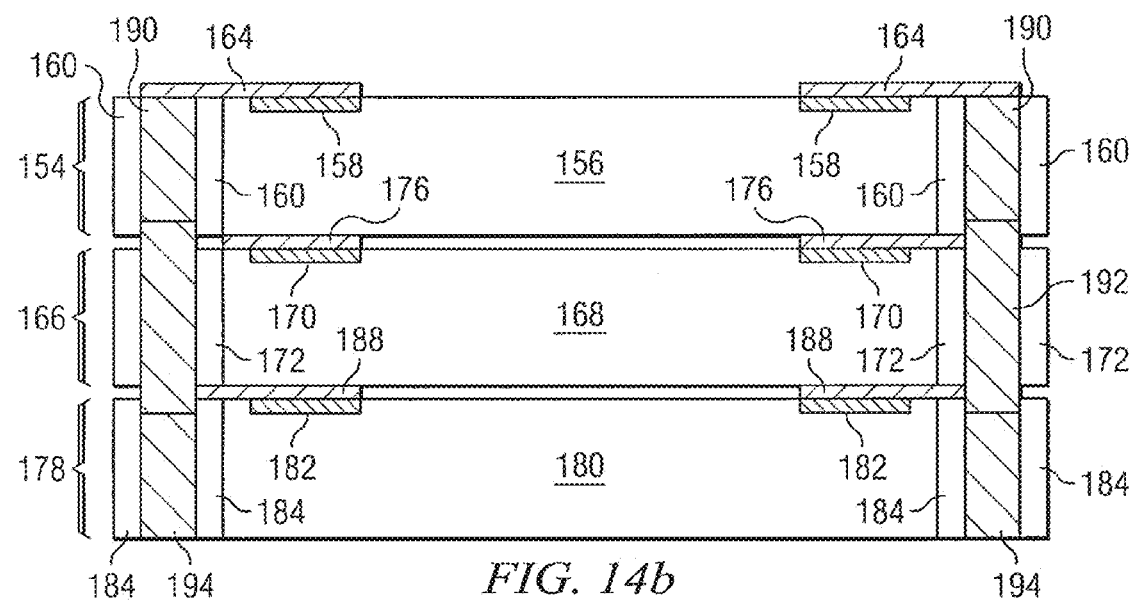

FIGS. 14a-14b illustrate semiconductor packages having THVs formed within the saw streets of a wafer using an organic filler material, the THVs include a double protrusion for package stacking. In FIG. 14a, package 154 includes die 156 having contact pads 158. Organic material 160 is deposited around a periphery of die 156. Through holes are formed in organic material 160 and a conductive material is deposited into the holes to form THVs 190. A top surface of THVs 190 is approximately coplanar with a top surface of die 156. A bottom surface of THVs 190 is recessed behind a bottom surface of die 156. RDL 164 is deposited over die 156 to form an electrical connection between contact pads 158 and THVs 190.

Package 166 includes die 168 having contact pads 170. Organic material 172 is deposited around a periphery of die 168. Through holes are formed in organic material 172 and a conductive material is deposited into the holes to form THVs 192. A top surface of THVs 192 protrudes above a top surface of die 168. A bottom surface of THVs 192 protrudes past a bottom surface of die 168. RDL 176 is deposited over die 168 to form an electrical connection between contact pads 170 and THVs 192.

Package 178 includes die 180 having contact pads 182. Organic material 184 is deposited around a periphery of die 180. Through holes are formed in organic material 184 and a conductive material is deposited into the holes to form THVs 194. A top surface of THVs 194 is recessed behind a top surface of die 180. A bottom surface of THVs 194 is approximately coplanar with a bottom surface of die 180. RDL 188 is deposited over die 180 to form an electrical connection with contact pads 182.

Turning to FIG. 14b, the three packages are connected. THVs 190 of package 154 are joined to THVs 192 of package 166 to electrically interconnect dies 156 and 168. THVs 192 of package 166 are joined to THVs 194 of package 178 to electrically interconnect dies 168 and 180. THVs 190, 192, and 194 are connected using direct metal bonding, adhesive bonding, solder paste connections, or another connection process.

FIGS. 15a-15f illustrate a process of forming THVs in the saw street region of a wafer using an organic filler material to form a package, the package includes back-to-back stacked dies. Wafer 200 includes a Si or other bulk semiconductor substrate material. Within wafer 200 a plurality of dies 202 is formed. Contact pads 204 are formed over a surface of dies 202 using a PVD, CVD, electrolytic plating, or electroless plating process. Within wafer 200, a plurality of saw streets 206 is formed between dies 202. Saw streets or scribes 206 include non-functional regions of wafer 200 through which a saw or other cutting or routing device can penetrate to separate the individual die 202 within wafer 200. Wafer 200 is mounted over expansion table 208 using a layer of adhesive. Expansion table 208 includes any substrate, apparatus or other structure suitable for mounting a plurality of semiconductor die or other electronic components and creating and/or expanding gaps between each of the semiconductor die or electronic components. The adhesive layer includes a thermal epoxy adhesive material, for example.

Wafer 210 includes a plurality of dies 212. Contact pads 214 are formed over a surface of dies 212 using a PVD, CVD, electrolytic plating, or electroless plating process. Within wafer 210, a plurality of saw streets 216 is formed between dies 212. Saw streets or scribes 216 include non-functional regions of wafer 210 through which a saw or other cutting or routing device can penetrate to separate the individual die 212 within wafer 210. Wafer 210 is mounted to wafer carrier 218 using a layer of adhesive. Wafer carrier 218 can include glass, Si, ceramic, metal, polymer composite, or another rigid material. In an alternative embodiment, wafer carrier 218 includes an expansion table or substrate. After being mounted, a backside of both wafers 200 and 210 are backgrinded to remove material and minimize a height of the wafers. Wafer 210 is mounted over wafer 200 using adhesive bonding that includes adhesive layer 220 or a direct bonding process. Adhesive layer 220 includes a thermal epoxy adhesive material, for example.

Figure 15A:
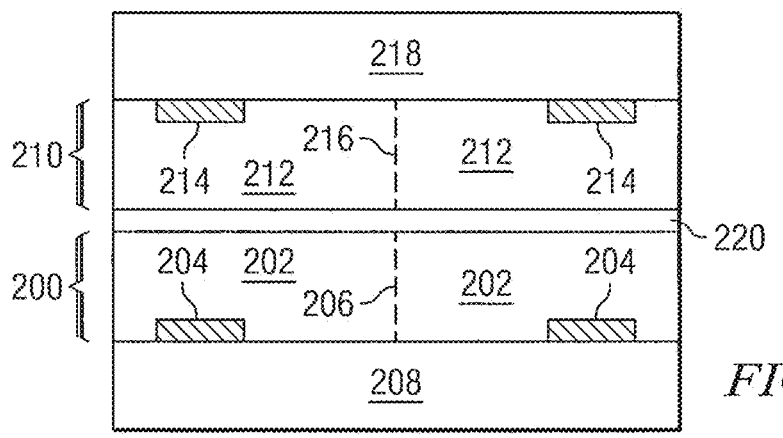
FIGS. 15a-15f illustrate a process of forming THVs in the saw street region of a wafer using an organic filler material to form a package, the package includes back-to-back stacked dies.
Figure 15B:
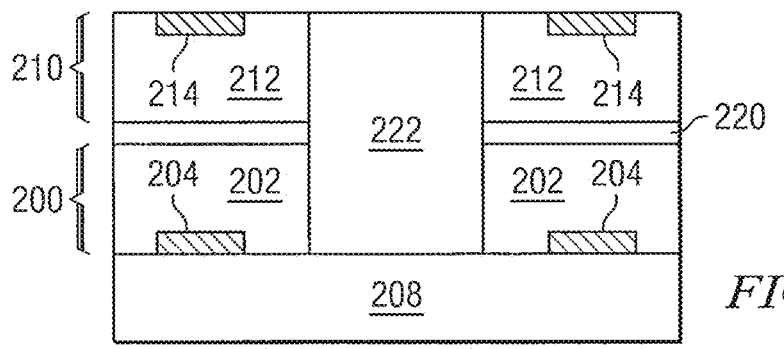

Turning to FIG. 15b, after wafer 210 is mounted to wafer 200, wafer carrier 218 is removed. Both wafer 200 and 210 are diced and separated using expansion table 208. Organic material 222 is deposited into the gap between dies 202 and 212 by spin-coating or needle dispensing. Organic material 222 includes BCB, polyimide, or acrylic resin.

Figure 15C:
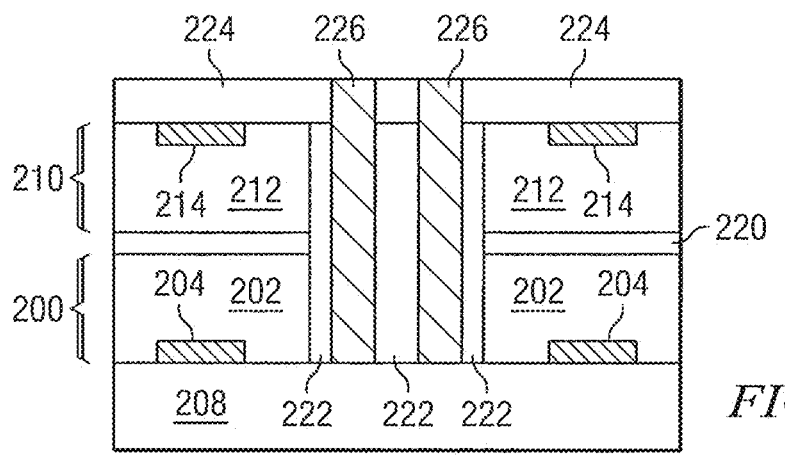

Turning to FIG. 15c, mask 224 is deposited and patterned over dies 202 and 212 and organic material 222. Mask 224 includes a photoresist material and is used to etch portions of organic material 222. With mask 224 deposited and patterned, organic material 222 is etched to form through holes. A conductive material is deposited into the through holes to form THVs 226. THVs 226 may include Cu, Au, Ag, or another conductive material.

Figure 15D:
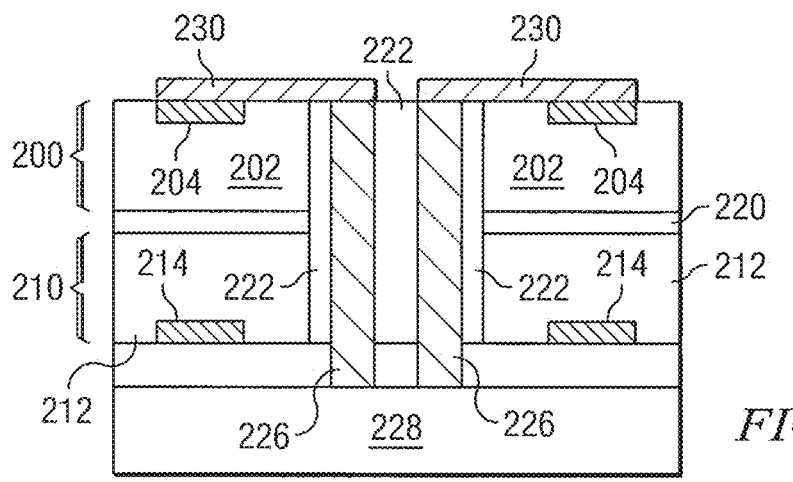

Turning to FIG. 15d, the package is inverted and mounted to a process carrier. Expansion table 208 and any adhesive layer connecting wafer 200 to expansion table 208 are removed. The package is inverted and mask 224 formed over wafer 210 is mounted to process carrier 228 using an adhesive. Process carrier 228 can include glass, Si, ceramic, metal, polymer composite, or another rigid material. RDL 230 is deposited over the package to electrically connect contact pads 204 of dies 202 to THVs 226.

Figure 15E:
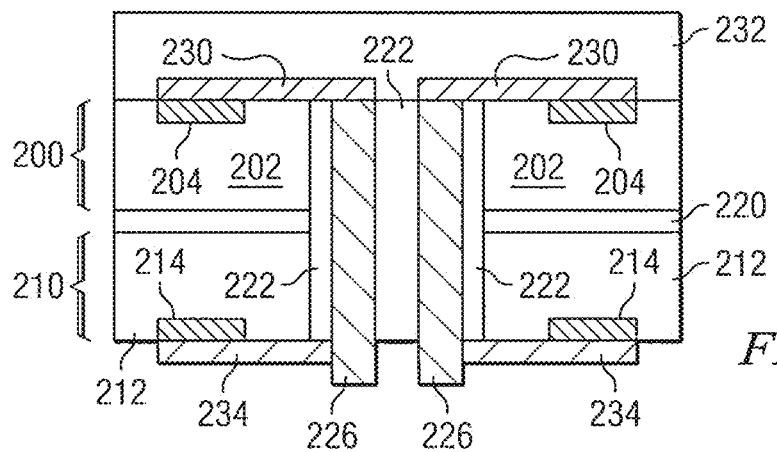

Turning to FIG. 15e, the package is connected to an additional process carrier. Wafer 200 is connected to process carrier 232 using an adhesive material. Process carrier 228 is removed and RDL 234 is deposited over wafer 210. RDL 234 electrically connects contact pads 214 of dies 212 to THVs 226.

Figure 15F:
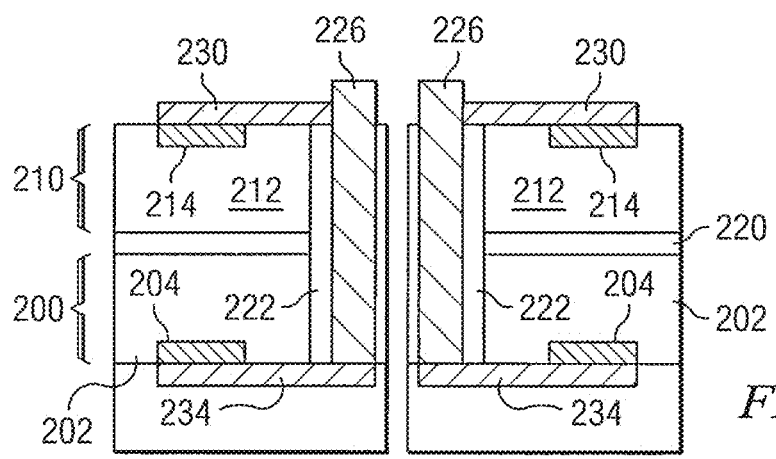

Turning to FIG. 15f, the device is inverted and dies 202 and 212 are singulated by cutting along organic material 222 deposited between the dies. In a final step, process carrier 232 is removed.

FIG. 16 illustrates a package having THVs formed in the saw street region of a wafer using an organic filler material, the package includes back-to-back stacked dies. In FIG. 16, die 234 having contact pads 236 is mounted to die 238 having contact pads 240 using adhesive layer 242. Dies 234 and 238 are mounted in a back-to-back configuration. In this configuration, vias are formed in the organic material after the dies are mounted to one another. If the dies were mounted in a face-to-back configuration, a two step etching process may be used to form vias in the organic material. In the two-step etching process a first die is mounted and vias are etched, the second die is then mounted and a second via is etched in the organic material, the second via connecting to the first. In FIG. 16, organic material 244 is deposited into the gaps formed between dies 234 and dies 238. Organic material 244 is etched using a photolithography or other etching process to form vias into which a conductive material is deposited to form THVs 246. THVs 246 protrude past a top surface of die 234. RDL 248 is deposited over die 234 to form an electrical connection between contact pads 236 of die 234 and THVs 246. RDL 250 is deposited over die 238 to form an electrical connection between contact pads 240 of die 238 and THVs 246.

FIGS. 17a-17e illustrate a process of forming THVs in the saw street region of a wafer using an organic filler material to form a package, the package includes back-to-back stacked dies of different geometries. Wafer 252 includes a Si or other bulk semiconductor substrate material. Within wafer 252 a plurality of dies 254 is formed. Contact pads 256 are formed over a surface of dies 254 using a PVD, CVD, electrolytic plating, or electroless plating process. Within wafer 252, a plurality of saw streets 258 is formed between dies 254. Saw streets or scribes 258 include non-functional regions of wafer 252 through which a saw or other cutting or routing device can penetrate to separate the individual die 254 within wafer 252. Wafer 252 is mounted over expansion table 260 using adhesive layer 262. Expansion table 260 includes any substrate, apparatus or other structure suitable for mounting a plurality of semiconductor die or other electronic components and creating and/or expanding gaps between each of the semiconductor die or electronic components. Adhesive layer 262 includes a thermal epoxy adhesive material, for example. Sidewalls 264 include a physical structure for defining an outer boundary of the package and controlling the deposition and flow of organic materials or encapsulants.

Turning to FIG. 17b, wafer 252 is diced and separated using expansion table 260. Dies 266 having contact pads 268 and a differing geometry from dies 254 are deposited over dies 254 using adhesive layers 270. Dies 266 may include semiconductor dies such as memory, controllers, ASICs, processors, microcontrollers, or combinations thereof.

Figure 17C:
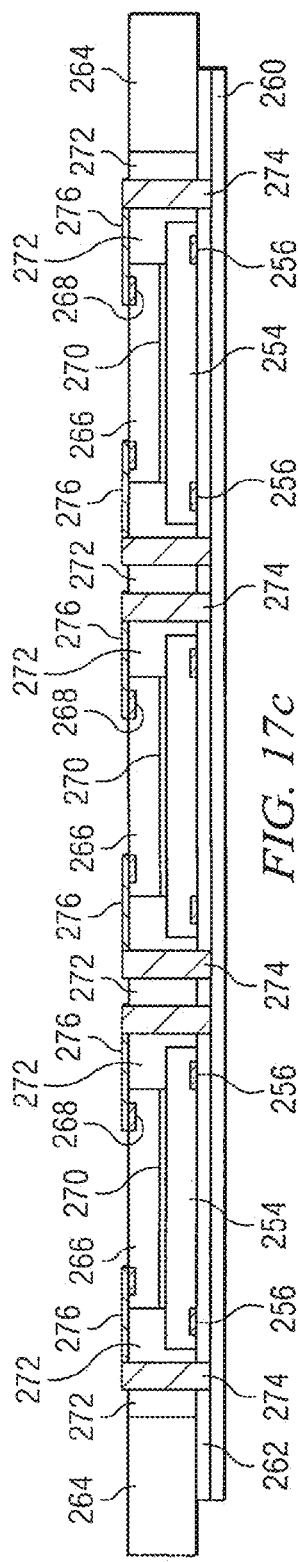

Turning to FIG. 17c, organic material 272 is deposited into the gaps between dies 254 and 266 by spin-coating or needle dispensing. Deposition of organic material 272 is controlled by sidewalls 264. Organic material 272 includes BCB, polyimide, or acrylic resin. RDL 276 includes a conductive material and is deposited over the package and electronically connected to contact pads 268 of dies 266. Organic material 272 and adhesive layer 262 are etched to form through holes. A conductive material is deposited into the through holes to form THVs 274. THVs 274 may include Cu, Au, Ag, or another conductive material.

Figure 17D:
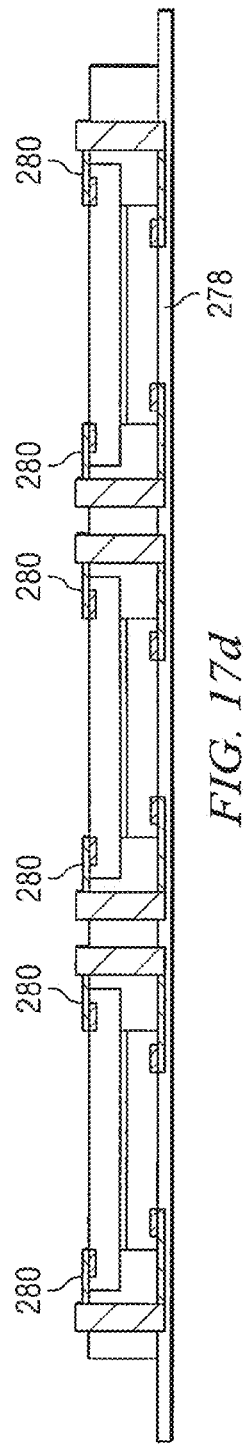

Turning to FIG. 17d, expansion table 260 and adhesive layer 262 are removed and the package is inverted and mounted to temporary carrier 278 using an adhesive. Temporary carrier 278 can include glass, Si, ceramic, metal, polymer composite, or another rigid material. RDL 280 is deposited over the package to electrically connect contact pads 256 of dies 254 to THVs 274.

Figure 17E:
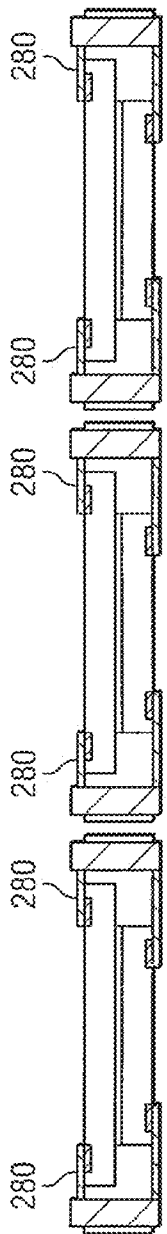

Turning to FIG. 17e, temporary carrier 278 is removed and the packages are singulated by cutting along organic material 272 deposited between the dies.

FIG. 18 illustrates a package having THVs formed in the saw street region of a wafer using an organic filler material, the package includes back-to-back stacked dies of different sizes. In FIG. 18, die 282 having contact pads 284 is mounted to die 286 having contact pads 288 using adhesive layer 290. The dimensions of die 286 differ from those of die 282. Organic material 292 is deposited into the gaps formed around dies 282 and dies 286. Organic material 292 is etched using a photolithography or other etching process to form vias into which a conductive material is deposited to form THVs 294. THVs 294 protrude past a bottom surface of the package. RDL 296 is deposited over die 282 to form an electrical connection between contact pads 284 of die 282 and THVs 294. RDL 298 is deposited over die 286 to form an electrical connection between contact pads 288 of die 286 and THVs 294. In one embodiment, dies 282 and 286 may include single or multiple dies, each die including different functionality. The varying geometries of the dies may include differences in width, length and height.

FIG. 19 illustrates a package having THVs formed in the saw street region of a wafer using an organic filler material, the package includes a through silicon via (TSV). In FIG. 19, die 30 having contact pads 32 is formed within a wafer. The wafer is diced and the individual die of the wafer are separated using an expansion table. Organic material 34 is deposited into the gaps formed between the individual dies. Organic material 34 is etched using a photolithography or other etching process to form vias. Die 30 is also etched to form holes. A conductive material is deposited into the holes to form TSV 300 within die 30. Organic material 34 is etched and a conductive material is deposited into the resulting vias to form THVs 36. THVs 36 protrude past a bottom surface of die 30. TSVs 300 do not extend beyond a surface of die 30. RDL 38 is deposited over the device to form an electrical connection between contact pads 32 of die 30 and THVs 36 and TSVs 300. Using the present method, a plurality of TSV may be formed in different locations within the package. TSVs may be formed in an interior portion of the die such that the die contact pads are formed between the TSV and the saw street surrounding the die. The TSVs may be formed with protrusions or recesses, depending upon the application.

FIG. 20 illustrates a package having THVs formed in the saw street region of a wafer using an organic filler material, the package includes an optical device and a transparent protective layer. In FIG. 20 die 30 having contact pads 32 is formed within a wafer. Die 30 includes an optically active area or optical device 302. The wafer is diced and the individual die of the wafer are separated using an expansion table. Organic material 34 is deposited into the gaps formed between the individual dies. Organic material 34 is etched using a photolithography or other etching process to form vias into which a conductive material is deposited to form THVs 36. THVs 36 protrude past a bottom surface of die 30. RDL 38 is deposited over the device to form an electrical connection between contact pads 32 of die 30 and THVs 36. Protective layer 304 is deposited over the package to provide physical support and protection to die 30 and, specifically, optically active area 302 of die 30. Protective layer 304 may include a transparent material such as quartz glass or a transparent plastic material. Resin 306 is deposited over protective layer 304 to provide additional physical support. Resin 306 may include a resin material such as transparent epoxy resin, acrylic resin, polyimide resin, or a mixture thereof. Glass layer 308 is deposited over resin 306 to provide additional physical support to the package. In alternative embodiments, THVs may be formed through one or more of protective layer 304, resin 306, and glass layer 308.

Figure 21:
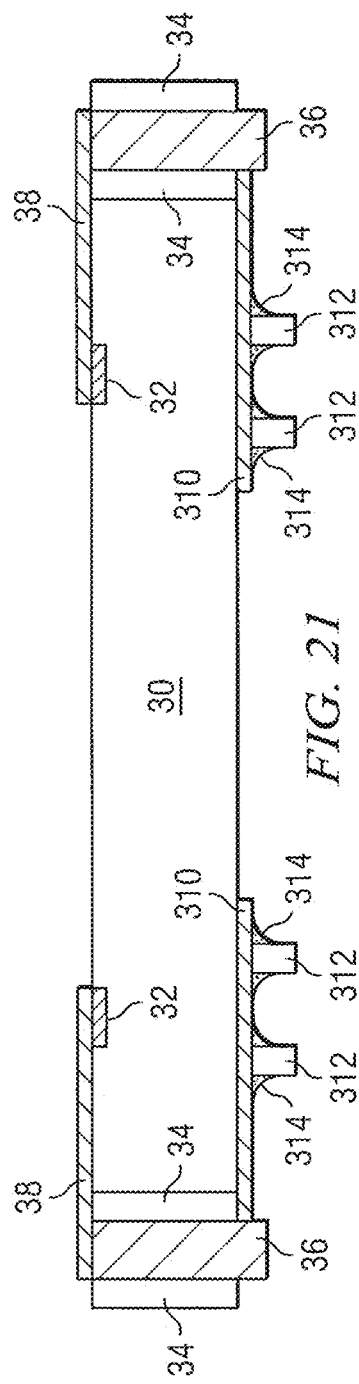
FIG. 21 illustrates a package having THVs formed in the saw street region of a wafer using an organic filler material and an RDL formed over a backside of the package.

FIG. 21 illustrates a package having THVs formed in the saw street region of a wafer using an organic filler material and an RDL formed over a backside of the package. In FIG. 21 die 30 having contact pads 32 is formed within a wafer. The wafer is diced and the individual die of the wafer are separated using an expansion table. Organic material 34 is deposited into the gaps formed between the individual dies. Organic material 34 is etched using a photolithography or other etching process to form vias into which a conductive material is deposited to form THVs 36. THVs 36 protrude past a bottom surface of die 30. RDL 38 is deposited over the device to form an electrical connection between contact pads 32 of die 30 and THVs 36. RDL 310 is formed over a backside of the package and is electronically connected to THVs 36. Devices or components 312 are connected to RDL 310 and include passive devices such as capacitors, inductors, and resistors or electronic circuits or other packaged semiconductor devices. Devices 312 are connected to RDL 310 using a suitable mount technology such as wirebonding, studbumping, or other surface mount technologies (SMTs). In FIG. 21, devices 312 are connected to RDL 310 using adhesive or underfill 314. In alternative embodiments, RDL 310 or other RDLs may be used as connection points for additional devices (including active and passive devices), bumps, packages, or other semiconductor dies.

Figure 22:
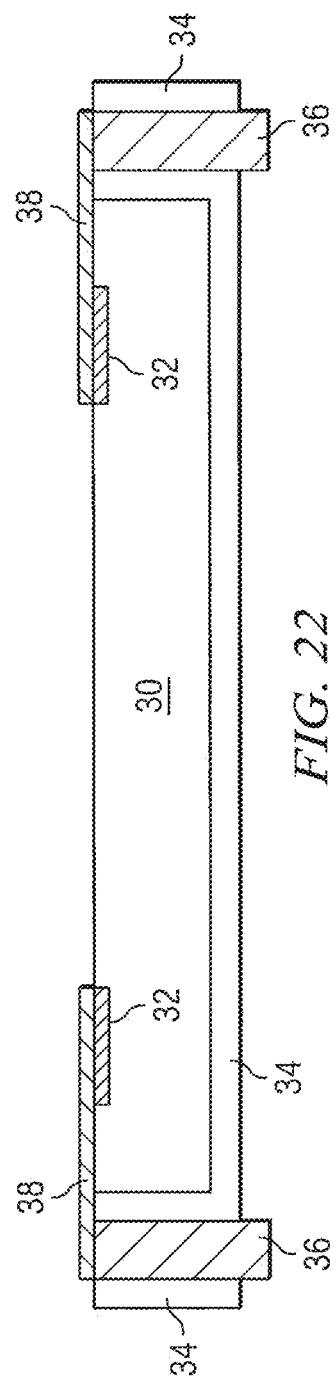
FIG. 22 illustrates a package having THVs formed in the saw street region of a wafer using an organic filler material, the organic material covers a backside of the package.

FIG. 22 illustrates a package having THVs formed in the saw street region of a wafer using an organic filler material, the organic material covers a backside of the package. In FIG. 22 die 30 having contact pads 32 is formed within a wafer. The wafer is diced and the individual die of the wafer are separated using an expansion table. Organic material 34 is deposited into the gaps formed between the individual dies. In the present embodiment, organic material 34 is deposited to approximately cover a backside of die 30. Organic material 34 may be deposited using a single-step deposition process, or an alternative process that deposits organic material 34 in a series of distinct steps. Organic material 34 is etched using a photolithography or other etching process to form vias into which a conductive material is deposited to form THVs 36. THVs 36 protrude past a bottom surface of die 30. RDL 38 is deposited over the device to form an electrical connection between contact pads 32 of die 30 and THVs 36.

FIGS. 23a-23c illustrate a first alternative process for depositing an organic material into gaps formed between a plurality of semiconductor devices. Dies or devices 316 having contact pads 318 are deposited over carrier or substrate 320 using adhesive 322. Dies or devices 316 may include packaged semiconductor dies and other electronic packages or integrated circuits (ICs) such as memory, controllers, ASICs, processors, microcontrollers, or combinations thereof. In one embodiment, dies 316 are deposited with an active side of the dies being face-down. Contact pads 318 are formed over a surface of dies 316 using a PVD, CVD, electrolytic plating, or electroless plating process. Carrier 320 includes glass, Si, ceramic, metal, polymer composite, or another rigid material suitable for mounting of electronic components. Adhesive layer 322 includes a thermal epoxy adhesive material, for example. Sidewall 324 of carrier 320 includes a physical structure for defining an outer boundary of the package and controlling the deposition and flow of organic materials or encapsulants over dies 316. After deposition, dies 316 are separated by a pre-determined gap G. The geometry of the gaps between dies 316 may be selected depending upon the application. In some cases, the gaps are consistent, while in others the gaps vary between individual dies 316.

Turning to FIG. 23b, organic material 326 is deposited into the pre-determined gaps between dies 316 by spin-coating, needle dispensing or another deposition process. Organic material 326 includes BCB, polyimide, or acrylic resin.

Turning to FIG. 23c, carrier 320 and adhesive layer 322 are removed. After removal of carrier 320, the package is inverted and dies 316 with organic material 326 are deposited over carrier 328 using adhesive layer 330.

FIGS. 24a-24c illustrate a second alternative process for depositing an organic material into gaps formed between a plurality of semiconductor devices, the organic material covers a backside of the semiconductor devices. Dies or devices 316 having contact pads 318 are deposited over carrier 320 using adhesive 322. In one embodiment, dies 316 are deposited with an active side of the dies being face-down. Contact pads 318 are formed over a surface of dies 316 using a PVD, CVD, electrolytic plating, or electroless plating process. Carrier 320 includes glass, Si, ceramic, metal, polymer composite, or another rigid material. Adhesive layer 322 includes a thermal epoxy adhesive material, for example. Sidewall 324 of carrier 320 includes a physical structure for defining an outer boundary of the package and controlling the deposition and flow of organic materials or encapsulants over dies 316. After deposition, dies 316 are separated by a pre-determined gap.

Turning to FIG. 24b, organic material 332 is deposited into the pre-determined gaps between dies 316 by spin-coating, needle dispensing or another deposition process. Organic material 332 includes BCB, polyimide, or acrylic resin and covers a back surface of dies 316.

Turning to FIG. 24c, carrier 320 and adhesive layer 322 are removed. After removal of carrier 320, the package is inverted and dies 316 with organic material 332 are deposited over carrier 328 using adhesive layer 330.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a plurality of first semiconductor die;
   forming a first insulating material between the first semiconductor die;
   forming a first conductive via through the first insulating material including a first surface of the first conductive via extending out from a first surface of the first insulating material, wherein a second surface of the first conductive via is coplanar with a second surface of the first insulating material;
   providing a plurality of second semiconductor die;
   forming a second insulating material between the second semiconductor die;
   forming a second conductive via through the second insulating material including a first surface of the second conductive via recessed below a first surface of the second insulating material; and
   stacking one of the first semiconductor die over one of the second semiconductor die and electrically connecting the first surface of the first conductive via to the first surface of the second conductive via.

2. The method of claim 1, further including forming a conductive layer over the first semiconductor die and the first insulating material.

3. The method of claim 1, wherein a second surface of the second conductive via is coplanar with a second surface of the second insulating material.

4. The method of claim 1, wherein a second surface of the second conductive via extends out from a second surface of the second insulating material.

5. A method of making a semiconductor device, comprising:
   providing a plurality of semiconductor die including a peripheral region between the semiconductor die;
   forming an adhesive layer over the semiconductor die;
   forming an insulating material in the peripheral region;
   forming a via extending through the insulating material and adhesive layer;
   depositing a conductive material in the via to form a conductive via extending through the insulating material and adhesive layer; and
   removing the adhesive layer leaving a first surface of the conductive via extending out from a first surface of the insulating material.

6. The method of claim 5, further including stacking a plurality of the semiconductor devices.

7. The method of claim 5, wherein the insulating material includes an organic material.

8. The method of claim 5, further including forming a conductive layer over the semiconductor die and the insulating material.

9. The method of claim 5, further including removing a portion of the conductive via opposite the first surface of the conductive via leaving a second surface of the conductive via recessed below a second surface of the insulating material.

10. A method of making a semiconductor device, comprising:
    providing a plurality of semiconductor die including a peripheral region between the semiconductor die;
    forming an insulating material in the peripheral region; and
    forming a conductive via through the insulating material including a first surface of the conductive via recessed below a first surface of the insulating material and a second surface of the conductive via recessed below a second surface of the insulating material.

11. The method of claim 10, further including stacking a plurality of the semiconductor devices.

12. The method of claim 10, further including forming a conductive layer over the semiconductor die and the insulating material.

13. A method of making a semiconductor device, comprising:
    providing a plurality of physically separated semiconductor die;
    forming an adhesive layer over the semiconductor die;
    forming an insulating material between the physically separated semiconductor die;
    forming a hole extending through the insulating material and adhesive layer;
    depositing a conductive material in the hole to form a conductive via extending through the insulating material and adhesive layer; and
    removing the adhesive layer leaving a first surface of the conductive via that is non-planar with a first surface of the insulating material and a second surface of the conductive via extending out from a second surface of the insulating material.

14. The method of claim 13, further including stacking a plurality of the semiconductor devices.

15. The method of claim 13, further including forming a conductive layer over the semiconductor die and the insulating material.

16. A method of making a semiconductor device, comprising:
    providing a physically separated semiconductor die;
    forming an adhesive layer over the semiconductor die;
    forming an insulating material around a periphery of the physically separated semiconductor die;
    forming a hole extending through the insulating material and adhesive layer;
    depositing a conductive material in the hole to form a conductive via extending through the insulating material and adhesive layer; and
    removing the adhesive layer leaving a first surface of the conductive via extending out from a first surface of the insulating material.

17. The method of claim 16, further including stacking a plurality of the semiconductor devices.

18. The method of claim 16, wherein a second surface of the conductive via is substantially coplanar with a second surface of the semiconductor die.

19. The method of claim 16, wherein the conductive via includes a second surface recessed below a second surface of the insulating material.

20. The method of claim 16, further including forming a conductive layer over the semiconductor die as an electrical connection between a contact pad of the semiconductor die and the conductive via.

21. The method of claim 16, wherein a second surface of the conductive via extends out from a second surface of the insulating material.

* * * * *